(12) United States Patent
Maeno

(10) Patent No.: US 6,504,772 B2
(45) Date of Patent: Jan. 7, 2003

(54) TESTING METHOD AND TEST APPARATUS IN SEMICONDUCTOR APPARATUS

(75) Inventor: Hideshi Maeno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/761,709

(22) Filed: Jan. 18, 2001

(65) Prior Publication Data

US 2001/0009523 A1 Jul. 26, 2001

(30) Foreign Application Priority Data

Jan. 26, 2000 (JP) ....................................... 2000-017536

(51) Int. Cl.[7] .............................. G11C 7/00; G01R 31/28
(52) U.S. Cl. .................. 365/201; 365/189.07; 714/724; 714/733
(58) Field of Search ............................ 365/201, 189.07, 365/200; 714/724, 726, 733

(56) References Cited

U.S. PATENT DOCUMENTS

| | | | | |
|---|---|---|---|---|
| 5,331,596 A | * | 7/1994 | Miyazawa et al. | 365/201 |
| 5,815,512 A | | 9/1998 | Osawa et al. | 365/201 |
| 5,956,350 A | | 9/1999 | Irrinki et al. | 365/201 |
| 6,067,262 A | * | 5/2000 | Ilrrinki et al. | 365/201 |
| 6,223,312 B1 | * | 4/2001 | Nozuyama | 714/724 |

FOREIGN PATENT DOCUMENTS

| | | |
|---|---|---|
| JP | 8-94718 | 4/1996 |
| JP | 11-265597 | 9/1999 |

* cited by examiner

*Primary Examiner*—Son T. Dinh
(74) *Attorney, Agent, or Firm*—Burns, Doane, Swecker & Mathis, LLP

(57) ABSTRACT

In a self-repairing operation, a first self-test of a RAM is performed at a first temperature to obtain a first RAM test result, a RAM built-in self-test circuit judges according to the first RAM test result that a faulty portion exists in the RAM, an LSI built-in self-repair circuit judges that the repair of the faulty portion of the RAM is possible, the LSI built-in self-repair circuit controls a redundancy control circuit to avoid the use of the faulty portion of the RAM in a normal operation, the temperature of the RAM is risen by operating the RAM or a logical circuit in a pseudo-self-test to change the first temperature to a second temperature, a second self-test of the RAM is performed at the second temperature to obtain a second RAM test result, and the LSI built-in self-repair circuit confirms that the repair of the faulty portion of the RAM is possible at each of the first and second temperatures by comparing the second RAM test result with the first RAM test result. Therefore, the reliability of the test of the RAM for the test condition change can be improved, and a correct operation of the RAM can be guaranteed at the first and second temperatures after a self-repair of the RAM.

20 Claims, 16 Drawing Sheets

FIG.12

TABLE OF TRUTH VALUES IN SCAN-PATH CIRCUIT WITH COMPARATOR

| MODE | SM | TM | CMP | EXPA | ANDSI | EXPB | TMSI | TMFB | CMP0LA | CMP1LA | CMP0LB | CMP1LB |
|---|---|---|---|---|---|---|---|---|---|---|---|---|
| NORMAL | 0 | 0 | 0 | 0 | 0 | 0 | 1 | 1 | 1 | 0 | 1 | 0 |
| SHIFT | 1 | 0 | 0 | 0 | 0 | 0 | 0 | 1 | 1 | 1 | 1 | 1 |
| HOLD | 1 | 1 | 0 | 0 | 0 | 0 | 1 | 0 | 1 | 1 | 1 | 1 |
| COMPARE | 1 | 1 | 1 | expa | 0 | expb | 1 | 0 | expa | $\overline{expa}$ | expb | $\overline{expb}$ |
| SHIFTING COMPARE | 1 | 1 | 1 | expa | 1 | expb | 0 | 0 | expa | $\overline{expa}$ | expb | $\overline{expb}$ |

(a)

(b)

TESTING METHOD AND TEST APPARATUS IN SEMICONDUCTOR APPARATUS

BACKGROUND OF THE INVENTION

1. Field of the Invention

The present invention relates to a testing method and test apparatus arranged in a semiconductor apparatus in which a to-be-tested circuit such as a random access memory (RAM) arranged in the semiconductor apparatus is tested to guarantee a correctly-performed normal operation of the semiconductor apparatus on condition that a redundancy circuit of the to-be-tested circuit is controlled according to a self-repair function of the semiconductor apparatus so as to avoid the use of a faulty portion of the to-be-tested circuit.

2. Description of Related Art

FIG. 17 is a block diagram showing the configuration of a conventional test device arranged in an electronic system (or a semiconductor apparatus) having a self-repair function. In the conventional test device arranged in the electronic system, a random access memory (RAM) of the electronic system is self-repaired by using the conventional test device.

In FIG. 17, a reference sign 100 indicates an electronic system (corresponding to a semiconductor apparatus) operable at each of a normal operation mode and a self-repair operation mode, and a reference sign 1 indicates a RAM to be self-tested and self-repaired. The RAM 1 has redundancy memory cells, so that a data storing capacity of the RAM 1 is larger than that required to perform a desired normal operation of the electronic system 100. A reference sign 2 indicates a logical circuit. The RAM 1 and the logical circuit 2 are arranged to perform the desired normal operation of the electronic system 100.

A reference sign 3 indicates a redundancy control circuit (hereinafter referred to as either redundancy control circuit or redundant control circuit). The redundancy control circuit 3 controls a signal transmission between the RAM 1 and the logical circuit 2 not to use a faulty portion of the RAM 1 at the normal operation mode of the electronic system 100. Also, the redundancy control circuit 3 controls a signal transmission between the RAM 1 and a RAM built-in self test circuit described later at the self-repair operation mode of the electronic system 100.

A reference sign 4 indicates the RAM built-in self-test circuit described above, and the RAM built-in self-test circuit 4 generates a test pattern to test the RAM 1 in the self-repair operation, checks output data produced in the RAM 1 in response to the test pattern and outputs a test result indicating whether the RAM 1 is correctly operated. A reference sign 5 indicates a RAM built-in self-repair circuit arranged for the RAM 1. The RAM built-in self-repair circuit 5 controls the redundant control circuit 3 at each of the operation modes (the normal operation mode and the self-repair operation mode), controls the RAM built-in self-test circuit 4 at the self-repair operation mode, collects the test result from the RAM built-in self-test circuit 4 at the self-repair operation mode and judges according to the test result whether or not the repair of the RAM 1 is possible.

A reference sign 6 indicates a logic built-in self-test circuit arranged to test the logical circuit 2. The logic built-in self-test circuit 6 generates pseudo-random numbers to test the logical circuit 2 and compresses an output result produced in the logical circuit 2 in response to the pseudo-random numbers.

The test device arranged in the electronic system 100 (or the semiconductor apparatus) is composed of the logical circuit 2, the RAM built-in self-test circuit 4, the RAM built-in self-repair circuit 5 and the logic built-in self-test circuit 6.

To compress the test result in the RAM built-in self-test circuit 4, a signature register type compressing unit is generally used. Also, because the logic built-in self-test circuit 6 is not necessarily required to perform a self-repair operation for the RAM 1, there is a case that the logic built-in self-test circuit 6 is omitted.

Next, an operation of the conventional test device is described.

FIG. 18 is a flow chart showing the procedure of a self-repair operation performed by the conventional test device shown in FIG. 17.

In a self-repair operation, the RAM built-in self-repair circuit 5 controls the redundant control circuit 3 and the RAM built-in self-test circuit 4, a test pattern generated in the RAM built-in self-test circuit 4 is transmitted to the RAM 1, and a test of the RAM 1 is performed (step ST1). In detail, output data of the RAM 1 is obtained in the RAM built-in self-test circuit 4 through the redundant control circuit 3, and it is judged by the RAM built-in self-test circuit 4 according to the output data whether or not a faulty portion exists in the RAM 1.

In cases where a faulty portion exists in the RAM 1, the RAM built-in self-repair circuit 5 collects a test result from the RAM built-in self-test circuit 4, and it is judged by the RAM built-in self-repair circuit 5 according to the test result whether or not the repair of the faulty portion of the RAM 1 is possible (step ST2). In cases where the repair of the faulty portion of the RAM 1 is possible, the RAM built-in self-repair circuit 5 controls the redundant control circuit 3 not to use the faulty portion of the RAM 1 in a normal operation(step ST3). That is, the redundant control circuit 3 controls the RAM 1 to use its redundancy memory cells in place of the faulty portion in the normal operation.

The above-described test device arranged in the electronic system 100 (or the semiconductor apparatus) having a self-repair function is, for example, disclosed in the Published Unexamined Japanese Patent Application H8-94718 (1996). Also, as is described in the U.S. Pat. No. 5,956,350, a technique, in which a self-repair is performed to avoid the use of faulty locations under a system temperature-rise condition, is known.

However, because the RAM built-in self-repair circuit 5 controls the redundant control circuit 3 according to a result of one test performed for the RAM 1 in the conventional test device, in cases where a fault not detected under ordinary conditions (for example, ordinary power supply voltage and temperature) set in one test exists in the RAM 1, there is a problem that a control of the RAM built-in self-repair circuit 5 for the redundant control circuit 3 to avoid the use of a portion relating to the faulty of the RAM 1 in specific conditions differing from the ordinary conditions cannot be correctly performed.

For example, in cases where a self-test of the electronic system 100 for the RAM 1 is performed just after an electric power is supplied to the electronic system 100 set to a low temperature (or an ambient temperature), a specific fault of the RAM 1 occurring only in cases where the RAM 1 is heated up to a high temperature corresponding to a stationary temperature in a normal operation of the electronic system 100 cannot be detected. In cases where the specific fault exists in the RAM 1, the electronic system 100 malfunctions under the high temperature condition.

In contrast, as is described in the U.S. Pat. No. 5,956,350, in cases where a self-test of the electronic system 100 for the RAM 1 is performed under a high temperature condition, a fault of the RAM 1 occurring only in cases where the RAM 1 is set to a low temperature cannot be detected. In cases where this fault exists in the RAM 1, the electronic system 100 malfunctions under the low temperature condition. Because the electronic system 100 has a power save function, there is a case that the electronic system 100 is cooled to a low temperature even though the electric power is supplied to the electronic system 100. Also, in cases where the electronic system 100 is a portable device, the electronic system 100 is cooled to a low temperature when an ambient temperature is suddenly lowered. Therefore, there is a problem in cases where a self-test of the electronic system 100 for the RAM 1 is performed under a high temperature condition.

SUMMARY OF THE INVENTION

An object of the present invention is to provide, with due consideration to the drawbacks of the conventional test device for testing the semiconductor circuit, a testing method and test apparatus of a semiconductor apparatus in which a to-be-tested circuit arranged in the semiconductor circuit is tested, while considering a change of a test condition, to guarantee a correct working of the to-be-tested circuit after a self-repair of the to-be-tested circuit and to improve the reliability of the test of the to-be-tested circuit for the test condition change.

The object is achieved by the provision of a method of testing a to-be-tested circuit having a redundancy circuit, comprising, an initial test condition testing step of performing a logical test of the to-be-tested circuit under a first test condition to obtain first fault information and judging, according to the first fault information, whether or not the repair of the faulty portion of the to-be-tested circuit by the redundancy circuit is possible, and a confirmation step including a first step of performing a logical test, which is the same as the logical test performed in the initial test condition testing step, for the to-be-tested circuit under a second test condition different from the first test condition to obtain second fault information, in a case where it is judged that the repair of the faulty portion of the to-be-tested circuit is possible, and a second step of comparing the first fault information with the second fault information to obtain a comparison result which indicates whether the to-be-tested circuit is correctly operable under each of the first test condition and the second test condition.

In the above steps, the logical test is performed for the to-be-tested circuit at first under the first test condition, and the same logical test is performed for the to-be-tested circuit under the second test condition. In cases where the first fault information obtained from the logical test under the first test condition agrees with the second fault information obtained from the logical test under the second test condition, because a fault of the to-be-tested circuit occurring under the first test condition is the same as that occurring under the second test condition, in cases where a redundancy circuit of the to-be-tested circuit is controlled to avoid the use of the faulty portion of the to-be-tested circuit detected in the logical test under the first test condition, a correct operation of the to-be-tested circuit under each of the first test condition and the second test condition can be confirmed.

Accordingly, the test for guaranteeing the correct operation of the to-be-tested circuit can be performed while considering a time change of the test condition, and the reliability of the test of the to-be-tested circuit for the test condition change can be improved in the testing method for the to-be-tested circuit arranged in the semiconductor apparatus.

It is preferred that the testing method further comprises a test condition change giving step of giving a change to the first test condition to change a test condition, under which the to-be-tested circuit is tested, to obtain the second test condition.

Because the first test condition is changed to the second test condition in the test condition change giving step, the test for guaranteeing the correct operation of the to-be-tested circuit can be performed while considering a time change of the test condition, and the reliability of the test of the to-be-tested circuit for the test condition change can be improved in the testing method for the to-be-tested circuit.

It is also preferred that the test condition change giving step includes a step of performing a pseudo-logical test for the to-be-tested circuit or a circuit arranged in a periphery of the to-be-tested circuit to change the test condition.

Because the pseudo-logical test is performed for the to-be-tested circuit or the peripheral circuit to change the first test condition to the second condition, the test for guaranteeing the correct operation of the to-be-tested circuit can be performed while considering a time change of the test condition, and the reliability of the test of the to-be-tested circuit for the test condition change can be improved in the testing method for the to-be-tested circuit arranged in the semiconductor apparatus.

It is also preferred that the test condition change giving step further includes a step of judging whether a test condition, under which the to-be-tested circuit is tested, reaches the second test condition, wherein the step of performing the pseudo-logical test is repeated in a case where it is judged in the judging step that the test condition does not reach the second test condition.

Therefore, the test for guaranteeing the correct operation of the to-be-tested circuit can be correctly performed while considering a time change of the test condition, and the reliability of the test of the to-be-tested circuit for the test condition change can be moreover improved in the testing method for the to-be-tested circuit.

It is also preferred that the first and second steps of the confirming step are repeated prescribed times with a change given to the second test condition, wherein the confirming step further includes a step of confirming a correct operation of the to-be-tested circuit according to a comparison result obtained every time the second step is performed.

Therefore, the correct operations of the to-be-tested circuit under the first test condition and the changing test conditions can be consecutively confirmed, the test for guaranteeing the correct operation of the to-be-tested circuit can be performed while considering a time change of the test condition, and the reliability of the test of the to-be-tested circuit for the test condition change can be improved in the testing method for the to-be-tested circuit arranged in the semiconductor apparatus.

It is also preferred that the first and second steps of the confirming step are repeated until the second test condition reaches a predetermined test condition.

Therefore, the correct operation of the to-be-tested circuit can be consecutively confirmed in the test condition range from the first test condition to the changing test condition differing from the first test condition by the fixed value, the test for guaranteeing the correct operation of the to-be-tested circuit can be performed while considering a time change of the test condition in the test condition range, and the reliability of the test of the to-be-tested circuit for the test condition change can be improved in the testing method for the to-be-tested circuit arranged in the semiconductor apparatus.

It is also preferred that the first test condition corresponds to a first temperature of the to-be-tested circuit, and the second test condition corresponds to a second temperature of the to-be-tested circuit.

Because the temperature of the to-be-tested circuit is adopted as the test condition, the test for guaranteeing the correct operation of the to-be-tested circuit can be performed while considering a time change of the temperature of the to-be-tested circuit, and the reliability of the test of the to-be-tested circuit can be improved in the testing method for the to-be-tested circuit.

It is also preferred that the first test condition corresponds to a first power supply voltage applied to the to-be-tested circuit, and the second test condition corresponds to a second power supply voltage applied to the to-be-tested circuit.

Because the power supply voltage applied to the to-be-tested circuit is adopted as the test condition, the test for guaranteeing the correct operation of the to-be-tested circuit can be performed while considering a time change of the power supply voltage applied to the to-be-tested circuit, and the reliability of the test of the to-be-tested circuit for the change of the power supply voltage applied to the to-be-tested circuit can be improved in the testing method for the to-be-tested circuit arranged in the semiconductor apparatus.

The object is also achieved by the provision of a test apparatus of a to-be-tested circuit, comprising a register for storing first fault information obtained by performing a logical test of the to-be-tested circuit under a first test condition, and a test circuit for judging according to the first fault information stored in the register whether or not a faulty portion exists in the to-be-tested circuit, judging according to the first fault information whether or not the repair of the faulty portion of the to-be-tested circuit is possible in a case where the faulty portion exists in the to-be-tested circuit, performing a logical test, which is the same as the logical test performed under the first test condition, for the to-be-tested circuit under a second test condition different from the first test condition to obtain second fault information in a case where the repair of the faulty portion of the to-be-tested circuit is possible, and comparing the first fault information with the second fault information to obtain a comparison result which indicates whether the to-be-tested circuit is correctly operable under each of the first test condition and the second test condition.

In the above configuration, in the test circuit, the existence of the faulty portion of the to-be-tested circuit is judged according to the first fault information obtained from the logical test of the to-be-tested circuit under the first test condition, and it is judged according to the first fault information that the repair of the faulty portion of the to-be-tested circuit is possible by avoiding the use of the faulty portion of the to-be-tested circuit. Thereafter, the logical test of the to-be-tested circuit under the second test condition is performed to obtain a second fault information, and the second fault information is compared with the first fault information. In cases where the second fault information agrees with the first fault information, because no faulty portion newly occurs under the second test condition other than the faulty portion of the to-be-tested circuit of which the repair is possible, it is confirmed that the to-be-tested circuit is correctly operable under each of the first test condition and the second test condition.

Accordingly, the test for guaranteeing the correct operation of the to-be-tested circuit can be performed while considering a time change of the test condition, and the reliability of the test of the to-be-tested circuit for the test condition change can be improved.

It is preferred that the test circuit performs a pseudo-logical test for the to-be-tested circuit or a circuit arranged in a periphery of the to-be-tested circuit to give a change to the first test condition.

Because a heat is generated by operating the to-be-tested circuit or the periphery circuit in the pseudo-logical test, the first test condition can be changed to the second test condition.

It is also preferred that the test circuit continues the pseudo-logical test until a test condition, under which the to-be-tested circuit is tested, reaches the second test condition.

In the above configuration, a heat is generated by operating the to-be-tested circuit or the periphery circuit in the pseudo-logical test, the first test condition can be changed to the second test condition. Also, in cases where a test condition detecting unit such as a temperature sensor is used to detect the first and second test conditions, the change of the test condition can be correctly set to the fixed value.

Accordingly, the test for guaranteeing the correct operation of the to-be-tested circuit can be correctly performed while considering a time change of the test condition, and the reliability of the test of the to-be-tested circuit for the test condition change can be moreover improved.

It is also preferred that the test circuit repeatedly performs the logical test, which is the same as the logical test performed under the first test condition, prescribed times with a change given to the second test condition, and performs a comparison of the first fault information with the second fault information obtained every time the logical test is performed, and the test circuit confirms, according to a comparison result obtained every time the comparison is performed, that the to-be-tested circuit is correctly operable.

In the above configuration, the logical test is repeatedly performed under a changing test condition while giving a change to the first test condition. Therefore, the test results of the to-be-tested circuit can be consecutively confirmed while considering a time change of the test condition, and the correct working of the to-be-tested circuit can be guaranteed under the first test condition and the changing test conditions.

It is also preferred that the test circuit repeatedly performs the logical test until the second test condition reaches a predetermined test condition.

In the above configuration, in cases where a test condition detecting unit such as a temperature sensor is used to detect the test condition, the change of the test condition can be correctly set to the fixed value. Therefore, the logical test is repeatedly performed under a changing test condition until the change between the first test condition and the changing test condition of the logical test reaches a fixed value.

Accordingly, the test results of the to-be-tested circuit can be consecutively confirmed while considering a time change of the test condition in the test condition range of the fixed value starting from the first test condition, the correct working of the to-be-tested circuit can be guaranteed, and the reliability of the test of the to-be-tested circuit for the test condition change can be moreover improved.

It is also preferred that the first test condition corresponds to a first temperature of the to-be-tested circuit, and the second test condition corresponds to a second temperature of the to-be-tested circuit.

The test for guaranteeing the correct operation of the to-be-tested circuit can be performed while considering a time change of the temperature of the to-be-tested circuit, and the reliability of the test of the to-be-tested circuit can be improved.

It is also preferred that the first test condition corresponds to a first power supply voltage applied to the to-be-tested circuit, and the second test condition corresponds to a second power supply voltage applied to the to-be-tested circuit.

The test for guaranteeing the correct operation of the to-be-tested circuit can be performed while considering a time change of the power supply voltage applied to the to-be-tested circuit, and the reliability of the test of the to-be-tested circuit for the change of the power supply voltage applied to the to-be-tested circuit can be improved.

It is also preferred that the first and second steps of the confirming step are performed again with a change given to the second test condition when the comparison result indicates a match, while the first or second step is not performed any more when the comparison result indicates a mismatch.

It is also preferred that the test circuit further performs the logical test again with a change given to the second test condition when the comparison result indicates a match, while not performing the logical test any more when the comparison result indicates a mismatch.

BRIEF DESCRIPTION OF THE DRAWINGS

FIG. 12 is a table of truth values showing an operation of the scan-path circuit with the comparator shown in FIG. 11(a) at each of modes;

DETAILED DESCRIPTION OF THE PREFERRED EMBODIMENTS

The invention will now be described with reference to the accompanying drawings.

Embodiment 1

Figure 1:
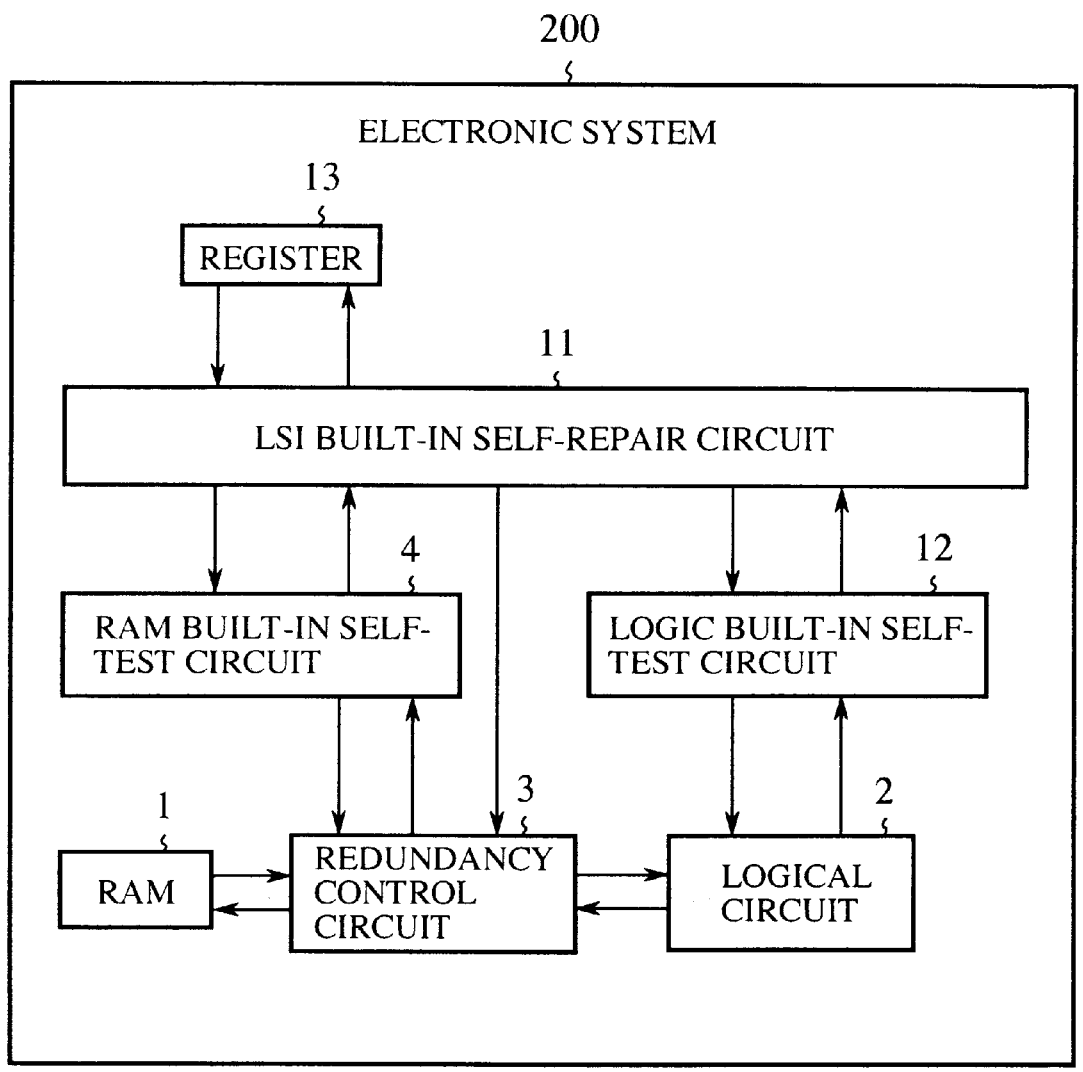
FIG. 1 is a block diagram showing the configuration of a test apparatus, which is arranged in an electronic apparatus including a to-be-tested circuit (for example, RAM) and is operated according to a testing method to test the to-be-tested circuit, according to a first embodiment of the present invention.

FIG. 1 is a block diagram showing the configuration of a test apparatus, which is arranged in an electronic apparatus including a to-be-tested circuit (for example, RAM) and is operated according to a testing method to test the to-be-tested circuit, according to a first embodiment of the present invention.

In FIG. 1, a reference sign 200 indicates an electronic system operable at each of a normal operation mode and a self-repair operation mode.

A reference sign 1 indicates a RAM (functioning as a to-be-tested circuit) to be self-repaired. The RAM 1 has redundancy memory cells, so that a data storing capacity of the RAM 1 is larger than that required to perform a desired normal operation in the electronic system 200. A reference sign 2 indicates a logical circuit arranged in a periphery of the RAM 1 functioning as a peripheral circuit). The RAM 1 and the logical circuit 2 are used in cases where the desired normal operation is performed in the electronic system 200.

A reference sign 3 indicates a redundancy control circuit (hereinafter referred to as redundant control circuit or redundancy control circuit). The redundant control circuit 3 controls a signal transmission between the RAM 1 and the logical circuit 2 not to use a faulty portion of the RAM 1 at the normal operation mode of the electronic system 200. Also, the redundant control circuit 3 controls a signal transmission between the RAM 1 and a RAM built-in self test circuit described later at the self-repair operation mode of the electronic system 200.

Figure 17:
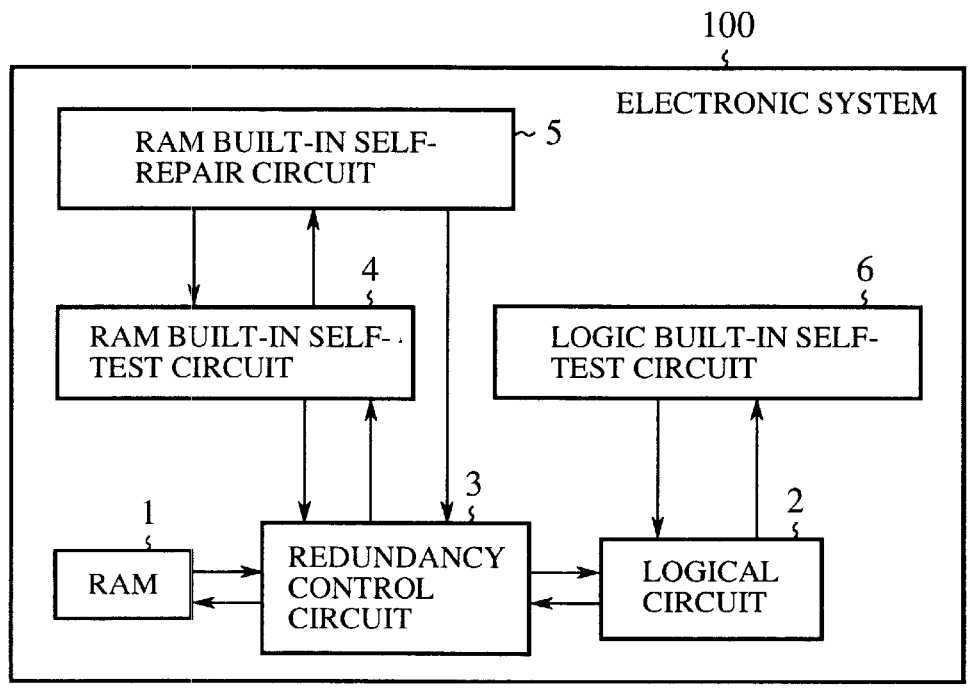
FIG. 17 is a block diagram showing the configuration of a conventional test device arranged in an electronic system (or a semiconductor apparatus) having a self-repair function.
Figure 18:
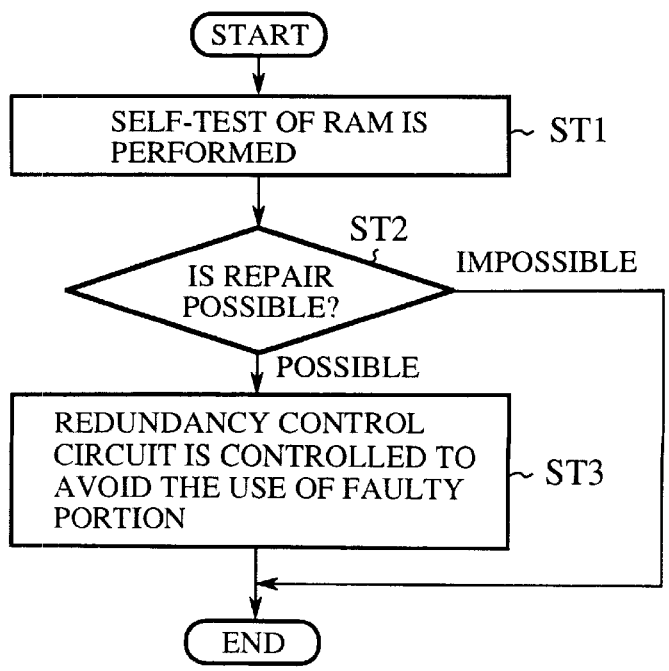
FIG. 18 is a flow chart showing the procedure of a self-repair operation performed by the conventional test device shown in FIG. 17.

A reference sign 4 indicates the RAM built-in self-test circuit functioning as a test circuit). The RAM built-in self-test circuit 4 generates a test pattern to test the RAM 1, checks output data produced in the RAM 1 in response to the test pattern to judge whether or not a faulty portion exists in the RAM 1, and outputs a RAM test result indicating fault information in cases where a faulty portion exists in the RAM 1. A reference sign 11 indicates an LSI built-in self-repair circuit (functioning as the test circuit). In the same manner as the control performed by the RAM built-in self-repair circuit 5 shown in FIG. 17, the LSI built-in self-repair circuit 11 controls the redundant control circuit 3 at each of the operation modes (the normal operation mode and the self-repair operation mode), controls the RAM built-in self-test circuit 4, collects the RAM test result from the RAM built-in self-test circuit 4 and judges according to the RAM test result whether or not the repair of the RAM 1 is possible.

A reference sign 12 indicates a logic built-in self-test circuit (functioning as the test circuit) arranged to test the logical circuit 2. The logic built-in self-test circuit 6 generates pseudo-random numbers to test the logical circuit 2 and compresses an output result produced in the logical circuit 2 in response to the pseudo-random numbers.

A reference sign 13 indicates a register for storing the RAM test result output from the RAM built-in self-test circuit 4 through the LSI built-in self-repair circuit 11.

A test apparatus according to the first embodiment is composed of the logical circuit 2, the redundancy control circuit 3, the RAM built-in self-test circuit 4, the LSI built-in self-repair circuit 11, the logic built-in self-test circuit 12 and the register 13.

The electronic system 200 is formed of one large scale integrated circuit LSI) corresponding to one semiconductor apparatus or is formed of a plurality of large scale integrated circuits LSI) corresponding to a plurality of semiconductor apparatuses. The test apparatus and the RAM 1 are arranged on the same semiconductor apparatus.

To compress the RAM test result in the RAM built-in self-test circuit 4, a signature register type compressing circuit is generally used.

Because the logic built-in self-test circuit 12 is not necessarily required to perform a self-repair operation for the RAM 1, there is a case that the logic built-in self-test circuit 12 is omitted. In cases where the logic built-in self-test circuit 12 is arranged in the electronic system 200, the LSI built-in self-repair circuit 11 controls the logic built-in self-test circuit 12.

Next, an operation of the test apparatus arranged in the electronic apparatus 200 is described.

Figure 2:
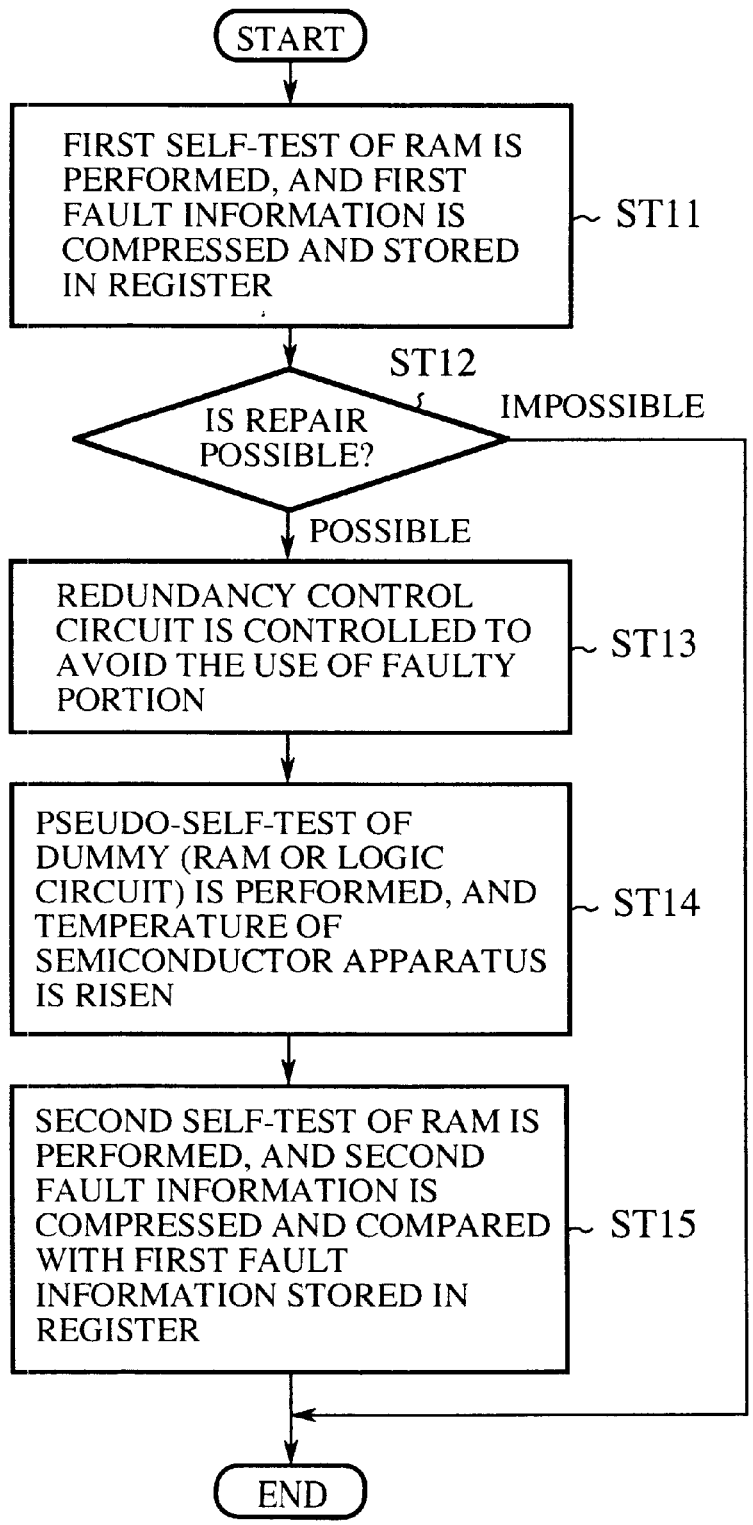
FIG. 2 is a flow chart showing a method of testing the to-be-tested circuit in a self-repair operation by using the test apparatus shown in FIG. 1.

FIG. 2 is a flow chart showing a method of testing the RAM 1 in a self-repair operation by using the test apparatus shown in FIG. 1.

In a self-repair operation, a first self-test (that is, a first logical test) of the RAM 1 is performed under a first test condition in which the RAM 1 is set to a first temperature, and a first RAM test result (that is, first fault information) is compressed and stored in the register 13 (a step ST11 denoting an initial test condition testing step).

In detail, in a self-repair operation, the LSI built-in self-repair circuit 11 controls the redundant control circuit 3 and the RAM built-in self-test circuit 4, a test pattern generated in the RAM built-in self-test circuit 4 is transmitted to the RAM 1 to perform a test of the RAM 1, output data of the RAM 1 is obtained in the RAM built-in self-test circuit 4 through the redundant control circuit 3, it is judged by the RAM built-in self-test circuit 4 according to the output data of the RAM 1 whether or not a faulty portion exists in the RAM 1. In cases where a faulty portion exists in the RAM 1, the RAM built-in self-test circuit 4 produces a first RAM test result indicating first fault information, the LSI built-in self-repair circuit 11 collects the first RAM test result compressed in the RAM built-in self-test circuit 4, and the first RAM test result is stored in the register 13 through the LSI built-in self-repair circuit 11.

Also, it is judged by the LSI built-in self-repair circuit 11 according to the first RAM test result whether or not the repair of the faulty portion of the RAM 1 is possible (a step ST12 denoting the initial test condition testing step). In cases where the repair of the faulty portion of the RAM 1 is possible, the LSI built-in self-repair circuit 11 controls the redundant control circuit 3 and the redundancy memory cells of the RAM 1 to avoid the use of the faulty portion of the RAM 1 in a normal operation(a step ST13 denoting a redundant circuit controlling step). That is, the redundant control circuit 3 controls the RAM 1 to use the redundancy memory cells of the RAM 1 in place of the faulty portion of the RAM 1 in the normal operation.

Thereafter, a pseudo-self-test of the logical circuit 2 or the RAM 1 is performed for the purpose of rising a temperature of the RAM 1 (a step ST14 denoting a test condition change giving step). That is, the logical circuit 2 or the RAM 1 used as a dummy is operated without judging a pseudo-test result obtained from the pseudo-self-test of the logical circuit 2 or the RAM 1 in the logic built-in self-test circuit 12 or the RAM built-in self-test circuit 4. In case where a pseudo-self-test of the logical circuit 2 is performed by operating the logical circuit 2, the temperature of the logical circuit 2 is risen to rise the temperature of the semiconductor apparatus having the logical circuit 2 and the RAM1, and the temperature of the RAM 1 arranged in a periphery of the logical circuit 2 is also risen according to a thermal conduction from the logical circuit 2 to the RAM 1. Also, in case where a pseudo-self-test of the RAM 1 is performed by operating the RAM1, the temperature of the RAM 1 is directly risen while rising the temperature of the semiconductor apparatus. In cases where the logic built-in self-test circuit 12 arranged in the semiconductor apparatus is also operated, the temperature of the semiconductor apparatus is rapidly risen, so that the temperature of the RAM 1 is rapidly risen.

Because the temperature of the semiconductor apparatus is gradually risen during the operation of the semiconductor apparatus without the pseudo-self-test of the logical circuit 2 or the RAM 1 and because the pseudo-self-test of the logical circuit 2 or the RAM 1 is performed to shorten a time required to rise the temperature of the semiconductor apparatus (that is, the temperature of the RAM 1) to a second temperature, the pseudo-self-test of the logical circuit 2 or the RAM 1 can be omitted.

Thereafter, in the same manner as the first self-test of the RAM 1, a second self-test (that is, a second logical test) of the RAM 1 is performed under a second test condition in which the RAM 1 is risen to the second temperature higher than the first temperature, a second RAM test result (that is, second fault information) is produced and compressed in the RAM built-in self-test circuit 4, and the second RAM test result is compared in the LSI built-in self-repair circuit 11 with the first RAM test result stored in the register 13 (a step ST15 denoting a confirmation step).

Thereafter, in cases where the second RAM test result matches the first RAM test result, it is confirmed in the LSI built-in self-repair circuit 11 that another faulty portion does not occur in the RAM 1 when the RAM 1 is risen to the second temperature, and it is confirmed in the LSI built-in self-repair circuit 11 that the repair of the faulty portion of the RAM 1 occurring at the first temperature of the RAM 1 or the (semiconductor apparatus) is possible at both the first and second test conditions. Therefore, a correct working of the RAM 1 in the normal operation is guaranteed at each of the first temperature and the second temperature higher than the first temperature on condition that the RAM 1 is controlled by the redundancy control circuit 3 to avoid the use of the faulty portion of the RAM 1 in the normal operation.

The redundancy memory cells of the RAM 1 controlled by the LSI built-in self-repair circuit 11 denotes a redundancy circuit of the RAM 1. In this case, because the redundant control circuit 3 controlled by the RAM built-in self-test circuit 4 controls the RAM1 to use the redundancy memory cells in place of the faulty portion of the RAM 1, it is applicable that the redundant control circuit 3 is included in the redundancy circuit.

In this embodiment, the redundant control circuit 3 is arranged outside the RAM 1. However, it is applicable that the redundant control circuit 3 be arranged in the RAM 1.

Accordingly, in the first embodiment, the self-test of the RAM 1 is twice performed in the same manner as each other while considering a time change of the test condition such as temperature of the RAM 1. That is, the logical test of the RAM 1 at the first temperature and the logical test of the RAM 1 at the second temperature higher than the first temperature are performed in the same manner as each other, the RAM test results obtained from the logical tests are compared with each other to check whether or not the faulty portion of the RAM 1 changes with the temperature of the RAM 1, and it is judged according to a compared result whether or not the repair of the faulty portion of the RAM 1 is possible. Therefore, a test of the RAM 1 can be performed at a high reliability according to the testing method in the test apparatus of the semiconductor apparatus while considering the change of the test condition such as temperature, and a correct working of the RAM 1 in the normal operation can be guaranteed.

Embodiment 2

Figure 3:
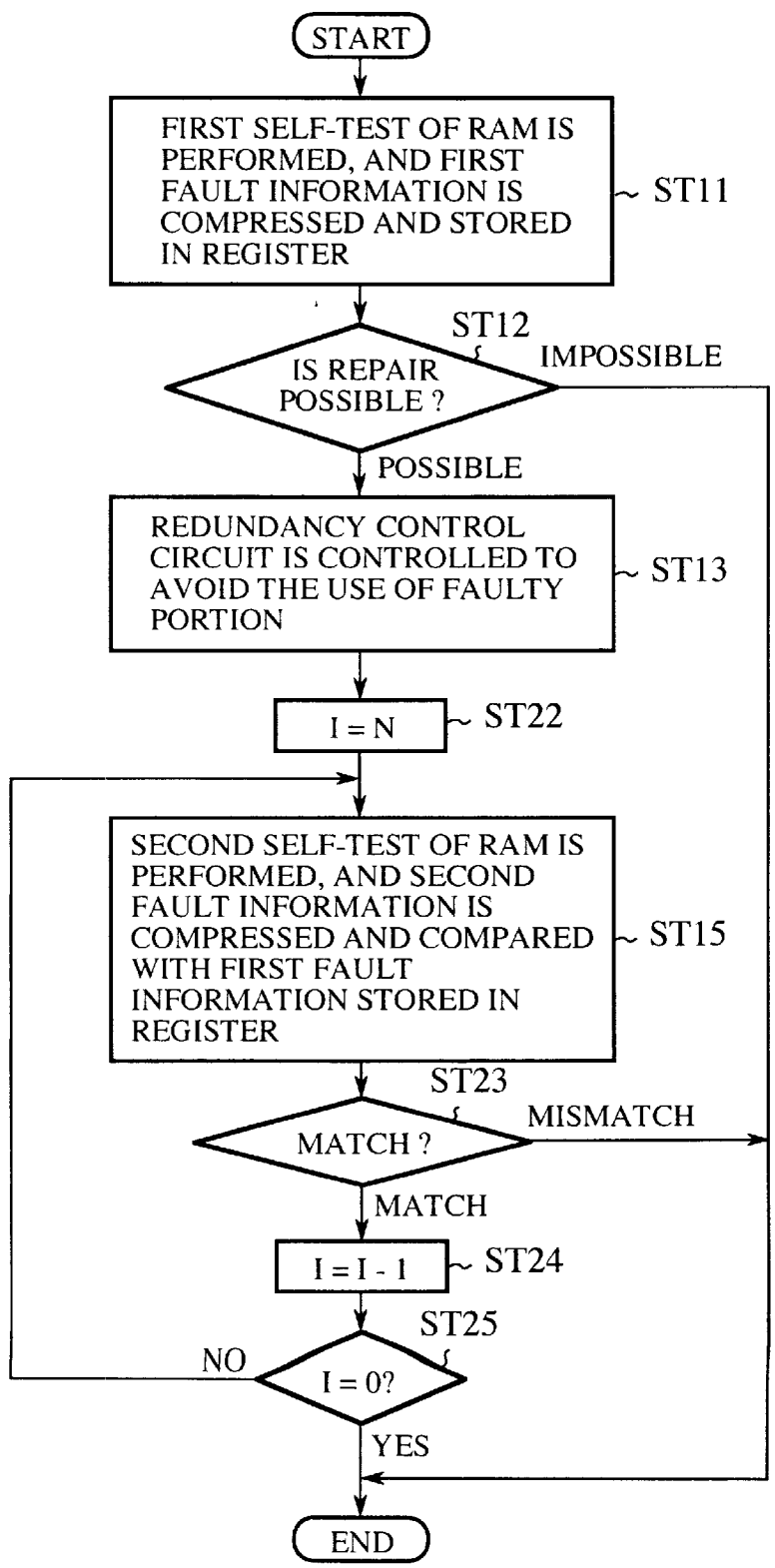
FIG. 3 is a flow chart showing a method of testing the RAM in a self-repair operation according to a second embodiment of the present invention.

FIG. 3 is a flow chart showing a method of testing the RAM 1 in a self-repair operation according to a second embodiment of the present invention. The configuration of a test apparatus according to the second embodiment is the same as that shown in FIG. 1 of the first embodiment. Also, operations performed in the same steps as those of FIG. 2 are the same as those of the steps of FIG. 2.

In the testing method according to the second embodiment, the first self-test (that is, the first logical test) of the RAM 1 is performed under the first test condition, and the first RAM test result (that is, the first fault information) is compressed and stored in the register 13 the step ST11). Thereafter, the judgment whether or not the repair of the faulty portion of the RAM 1 is possible is performed (the step ST12). In cases where the repair of the faulty portion of the RAM 1 is possible, the redundant control circuit 3 is controlled to avoid the use of the faulty portion of the RAM 1 in the normal operation the step ST13).

Thereafter, an I-th (I=2, 3, - - - , N+1) self-test of the RAM 1 is repeatedly performed N times in the same manner as the first self-test while a temperature of the semiconductor apparatus having the RAM 1 is gradually risen (steps ST22, ST24 and ST25 denoting the confirmation step), and an I-th RAM test result under an I-th test condition (or a changing test condition), in which the RAM 1 is set to an I-th temperature higher than the (I−1)-th temperature, is obtained at a current time each time the I-th self-test of the RAM 1 is performed. In this case, it is applicable that the logic built-in self-test circuit 12 be operated to rapidly rise the temperature of the RAM 1 in a period of the I-th self-tests.

Thereafter, the I-th RAM test result (that is, current fault information) currently obtained is compressed and compared with the first RAM test result stored in the register 13 each time the I-th self-test of the RAM 1 is performed (the step ST15 denoting the confirmation step). In cases where the I-th RAM test result does not match the first RAM test result (a step ST23 denoting the confirmation step), the comparison indicates that a faulty portion newly occurs in the RAM 1 under the I-th test condition currently obtained, so that it is judged in the LSI built-in self-repair circuit 11 that the repair of the faulty portion of the RAM 1 is impossible, and the procedure of the testing method is stopped.

In contrast, in cases where the I-th RAM test result matches the first RAM test result (the step ST23), because the comparison indicates that no faulty portion newly occurs in the RAM 1 in spite of the rising of the temperature of the RAM 1, it is confirmed in the LSI built-in self repair circuit 11 that the repair of the faulty portion of the RAM 1 under the I-th test condition is possible, and the self-test of the RAM 1 is repeated until the self-test of the RAM 1 is performed N times.

Finally, in cases where it is judged that the (N+1)-th RAM test result matches the first RAM test result, it is judged in the LSI built-in self-repair circuit 11 that the repair of the faulty portion of the RAM 1 under each of the I-th test conditions is possible, and the procedure of the testing method is completed. Therefore, a correct working of the RAM 1 in the normal operation is guaranteed in a temperature range from the first temperature to a prescribed temperature corresponding to the (N+1)-th test condition on condition that the RAM 1 is controlled by the redundancy control circuit 3 to avoid the use of the faulty portion of the RAM 1 in the normal operation.

In the testing method for the RAM 1 shown in FIG. 3, the temperature of the RAM 1 (or the semiconductor apparatus) is changed each time the I-th self-test of the RAM 1 is performed. However, it is applicable that a power supply voltage applied to the RAM 1 through the semiconductor apparatus be changed as a test condition in place of the temperature of the RAM 1 each time the I-th self-test of the RAM 1 is performed. For example, the power supply voltage is set to a low value in the first self-test of the RAM 1, and the power supply voltage is gradually increased each time the I-th self-test of the RAM 1 is performed. Also, it is applicable that the power supply voltage is changed in random. The control of the power supply voltage is, for example, performed in the LSI built-in self-repair circuit 11 for an electric source circuit (not shown) of the electronic system 200.

This control of the power supply voltage can be applied not only to the second embodiment but also to the first embodiment and following embodiments. Also, it is applicable that the power supply voltage applied to the RAM 1 and the temperature of the RAM 1 be changed together each time the I-th self-test of the RAM 1 is performed.

Accordingly, in the second embodiment, the self-test of the RAM 1 is repeatedly performed prescribed times in the same manner as each other while considering a time change of the test condition such as temperature of the RAM 1 (or the semiconductor apparatus) or the power supply voltage applied to the RAM 1 through the semiconductor apparatus. That is, the logical test of the RAM 1 under the test condition of the first temperature and the N logical tests of the RAM 1 under test conditions of the I-th temperatures respectively higher than the (I−1)-th temperature are performed in the same manner as each other, or the logical tests of the RAM 1 under test conditions of power supply voltages applied to the RAM 1 through the semiconductor apparatus are performed many times in the same manner as each other, the RAM test results are compared with each other to check whether or not the faulty portion of the RAM 1 changes with the temperature of RAM 1 (or the semiconductor apparatus) or the power supply voltage applied to the RAM 1 through the semiconductor apparatus, and it is judged according to a compared result whether or not the repair of the faulty portion of the RAM 1 is possible. Therefore, a test of the RAM 1 can be performed at a high reliability according to the testing method in the test apparatus of the semiconductor apparatus while considering the change of the test condition such as temperature or power supply voltage. Also, because results of the logical tests for the change of the temperature or the power supply voltage can be successively confirmed, the reliability of the test result for the change of the temperature or the power supply voltage can be heightened.

Embodiment 3

Figure 4:
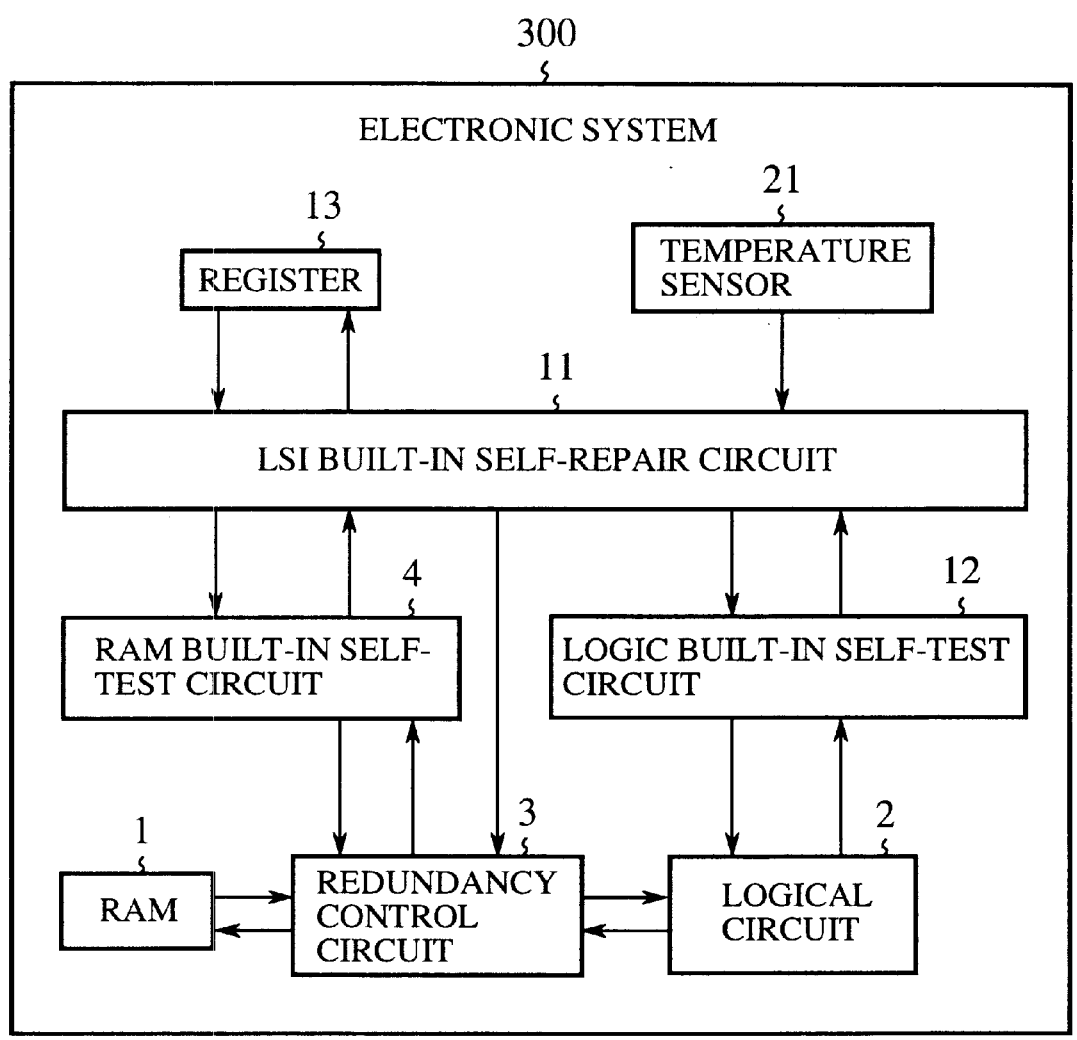
FIG. 4 is a block diagram showing the configuration of a test apparatus, which is arranged in an electronic apparatus including a to-be-tested circuit (for example, RAM) and is operated according to a testing method to test the to-be-tested circuit, according to a third embodiment of the present invention.

FIG. 4 is a block diagram showing the configuration of a test apparatus, which is arranged in an electronic apparatus including a to-be-tested circuit (for example, RAM) and is operated according to a testing method to test the to-be-tested circuit, according to a third embodiment of the present invention. In FIG. 4, composing elements having the same functions as those shown in FIG. 1 are indicated by the same reference signs as those of the composing elements of FIG. 1. Therefore, the description of the composing elements in FIG. 4 having the same functions as those of the composing elements in FIG. 1 is omitted.

In FIG. 4, a reference sign 300 indicates an electronic system operable at each of the normal operation mode and the self-repair operation mode. A reference sign 21 indicates a temperature sensor for detecting a temperature of the semiconductor apparatus in which the RAM 1, the circuits 2, 3, 4, 11 and 12 and the register 13 are arranged.

A test apparatus according to the third embodiment is composed of the logical circuit 2, the redundancy control circuit 3, the RAM built-in self-test circuit 4, the LSI built-in self-repair circuit 11, the logic built-in self-test circuit 12, the register 13 and the temperature sensor 21.

The electronic system 300 is formed of one large scale integrated circuit LSI) corresponding to one semiconductor apparatus or is formed of a plurality of large scale integrated circuits LSI) corresponding to a plurality of semiconductor apparatuses. The test apparatus and the RAM 1 are arranged on the same semiconductor apparatus. However, because an area occupied by the temperature sensor 21 is large, it is applicable that the LSI having the temperature sensor 21 differ from that having the RAM 1, the register 13 and the circuits 2, 3, 4, 11 and 12.

Figure 5:
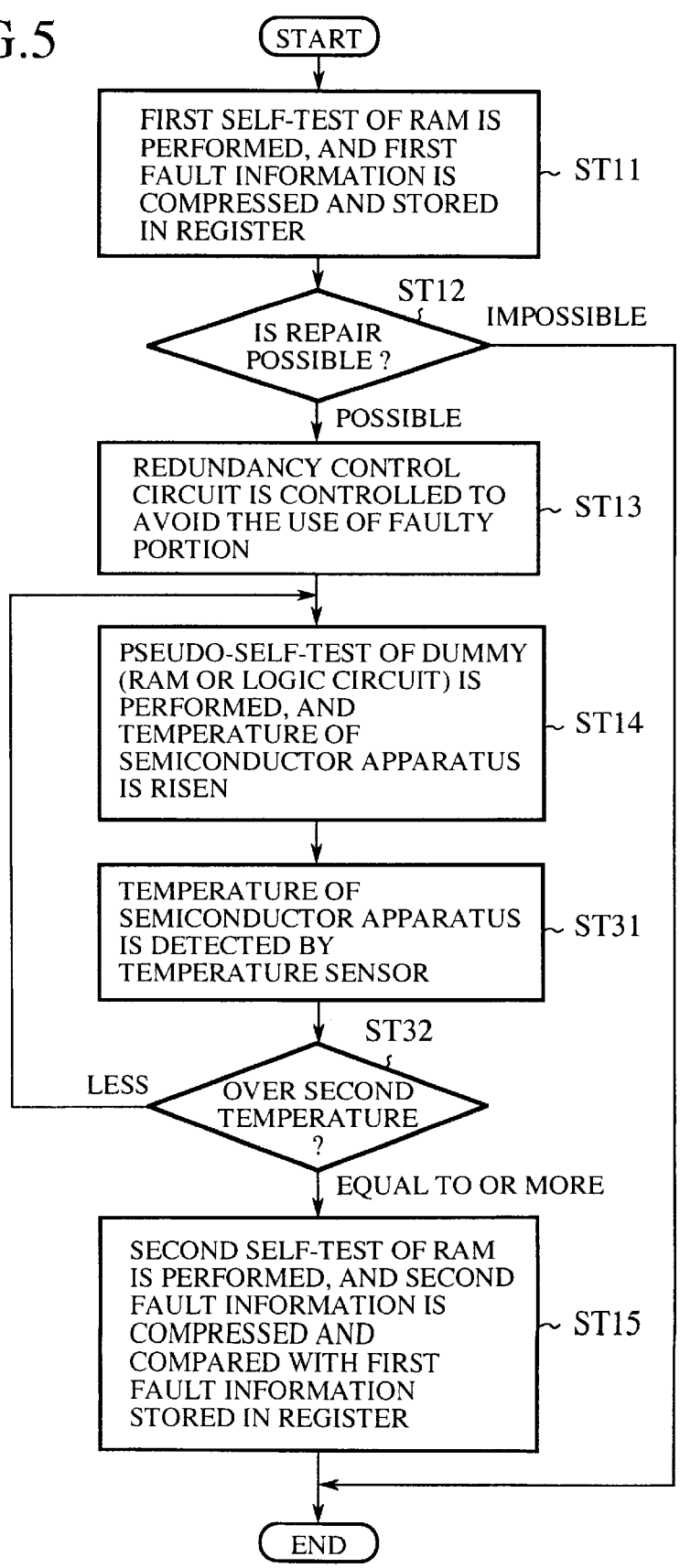
FIG. 5 is a flow chart showing a method of testing the RAM in a self-repair operation according to the third embodiment of the present invention.

FIG. 5 is a flow chart showing a method of testing the RAM 1 in a self-repair operation according to a third embodiment of the present invention. Operations performed in the same steps as those of FIG. 2 are the same as the operations of the steps of FIG. 2.

In the testing method according to the third embodiment, a pseudo-self-test, in which the logical circuit 2 or the RAM 1 is used as a dummy, is repeatedly performed under the control of the LSI built-in self repair circuit 11 to rise the temperature of the semiconductor apparatus having the RAM 1 until the temperature of the semiconductor apparatus reaches a prescribed temperature.

In detail, the first self-test (that is, the first logical test) of the RAM 1 is performed under the first test condition corresponding to the first temperature of the semiconductor apparatus detected by the temperature sensor 21, and the first RAM test result (that is, the first fault information) is compressed and stored in the register 13 (the step ST11). Thereafter, the judgment whether or not the repair of the faulty portion of the RAM 1 is possible is performed (the step ST12). In cases where the repair of the faulty portion of the RAM 1 is possible, the redundant control circuit 3 and the redundancy memory cells of the RAM 1 are controlled to avoid the use of the faulty portion of the RAM 1 in the normal operation (the step ST13).

Thereafter, the pseudo-self-test using the logical circuit 2 or the RAM 1 as a dummy is performed to rise a temperature of the semiconductor apparatus having the RAM 1 (the step ST14). Because the temperature of the semiconductor apparatus is gradually risen when a self-test of the RAM 1 is repeatedly performed, the pseudo-self-test is not necessarily required. In cases where the logic built-in self-test circuit 12 is also operated, the temperature of the semiconductor apparatus is rapidly risen.

Also, the detection of the temperature of the semiconductor apparatus performed by the temperature sensor 21 is continued (a step ST31 denoting the test condition change giving step), and it is judged in a temperature judging circuit (not shown) whether or not the temperature of the semiconductor apparatus detected by the temperature sensor 21 reaches a second temperature (step ST32 denoting the test condition change giving step). In cases where the semiconductor apparatus does not reach the second temperature, the procedure of the steps ST14, ST31 and ST32 is repeated.

In cases where it is judged in the step ST32 that the temperature of the semiconductor apparatus reaches the second temperature, because the temperature of the RAM 1 also reaches the second temperature, the second self-test (that is, the second logical test) of the RAM 1 is performed under the second test condition corresponding to the second temperature, the second RAM test result obtained in the second self-test is compressed and compared with the first RAM test result stored in the register 13 the step ST15).

In cases where the second RAM test result matches the first RAM test result, it is confirmed that another faulty portion does not occur even though the RAM 1 is risen to the second temperature, it is confirmed that the repair of the faulty portion of the RAM 1 occurring at the first temperature is possible under both the first and second test conditions. Therefore, a correct working of the RAM 1 in the normal operation is guaranteed at the first temperature and the second temperature higher than the first temperature on condition that the RAM 1 is controlled by the redundancy control circuit 3 to avoid the use of the faulty portion of the RAM 1 in the normal operation.

In this embodiment, the temperature judging circuit (not shown) is used in the step ST32 to judge whether or not the temperature of the semiconductor apparatus reaches the second temperature. However, it is applicable that the LSI built-in self repair circuit 11 judge whether or not the temperature of the semiconductor apparatus detected by the temperature sensor 21 reaches the second temperature.

In the testing method for the RAM 1 shown in FIG. 5, the temperature condition of the semiconductor apparatus is changed to perform the second self-test of the RAM 1. However, it is applicable that a power supply voltage applied to the RAM 1 through the semiconductor apparatus be changed as a test condition in place of the temperature. For example, the power supply voltage is set to a low value in the first self-test of the RAM 1, and the power supply voltage is increased when the second self-test of the RAM 1 is performed. Also, it is applicable that the power supply voltage is changed in random. The control of the power supply voltage is, for example, performed in the LSI built-in self-repair circuit 11 for an electric source circuit not shown) of the electronic system 300.

Accordingly, in the third embodiment, because the temperature of the semiconductor apparatus is always detected by the temperature sensor 21, a temperature difference between the first temperature and the second temperature can be set to a certain change, the temperature of the RAM 1 can be correctly set to the second temperature, and the second self-test of the RAM 1, of which the temperature is correctly set, can be performed.

Also, in the third embodiment, the self-test of the RAM 1 is twice performed in the same manner as each other while considering a time change of the test condition such as a temperature of the semiconductor apparatus or a power supply voltage applied to the RAM 1 through the semiconductor apparatus. That is, the logical test of the RAM 1 at the first temperature or a first power supply voltage and the logical test of the RAM 1 at the second temperature higher than the first temperature or a second power supply voltage differing from the first power supply voltage are performed in the same manner as each other, the RAM test results are compared with each other to check whether or not the faulty portion of the RAM 1 changes with the temperature of the semiconductor apparatus or the power supply voltage applied to the RAM 1 through the semiconductor apparatus, and it is judged according to a compared result whether or not the repair of the faulty portion of the RAM 1 is possible. Therefore, a test of the RAM 1 can be performed at a high reliability according to the testing method in the test apparatus of the semiconductor apparatus while considering the change of the test condition such as temperature or power supply voltage.

Embodiment 4

Figure 6:
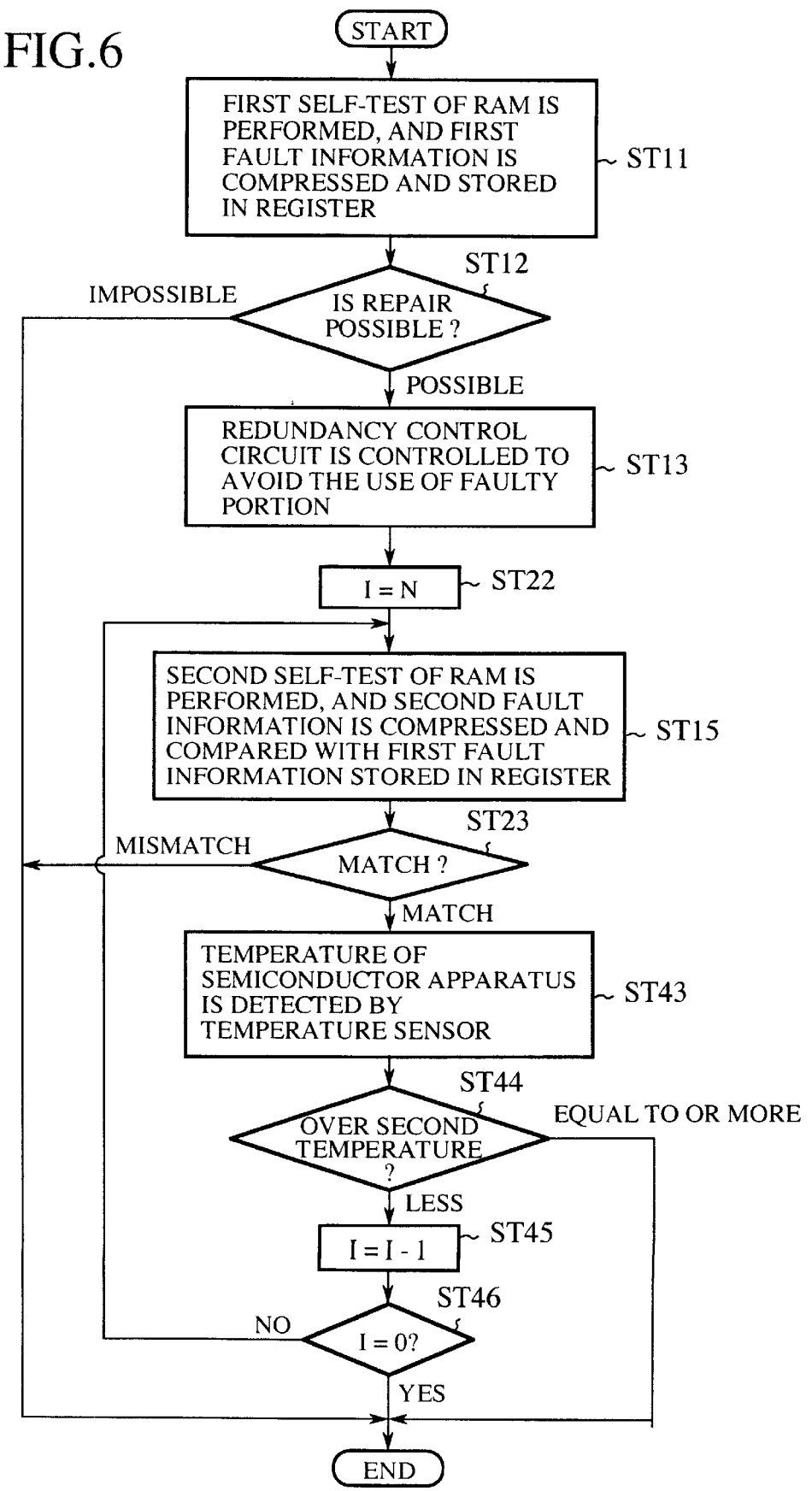
FIG. 6 is a flow chart showing a method of testing the RAM in a self-repair operation according to a fourth embodiment of the present invention.

FIG. 6 is a flow chart showing a method of testing the RAM 1 in a self-repair operation according to a fourth embodiment of the present invention. The configuration of a test apparatus according to the fourth embodiment is the same as that shown in FIG. 4 of the third embodiment. Also, operations performed in the same steps as those of FIG. 3 are the same as those of the steps of FIG. 3.

In the testing method according to the fourth embodiment, the first self-test (that is, the first logical test) of the RAM 1 is performed under the first test condition corresponding to the first temperature of the semiconductor apparatus detected by the temperature sensor 21, and the first RAM test result (that is, the first fault information) is compressed and stored in the register 13 (the step ST11). Thereafter, the judgment whether or not the repair of the faulty portion of the RAM 1 is possible is performed (the step ST12). In cases where the repair of the faulty portion of the RAM 1 is possible, the redundant control circuit 3 and the redundancy memory cells of the RAM 1 are controlled to avoid the use of the faulty portion of the RAM 1 in the normal operation (the step ST13).

Thereafter, an I-th (I=2, 3, - - - , N) self-test of the RAM 1 is repeatedly performed in the same manner as the first self-test while the temperature of the semiconductor apparatus having the RAM 1 is gradually risen. The I-th self-test of the RAM 1 is repeated N times or is continued until the temperature of the semiconductor apparatus detected by the temperature sensor 21 reaches a second temperature steps (ST22, ST44, ST45 and ST46). The second temperature is higher than the first temperature by a fixed value, and this fixed value is, for example, set in the LSI built-in self0 repair circuit 11.

In detail, each time an I-th self-test of the RAM 1 is performed, an I-th RAM test result (that is, current fault information) currently obtained is compressed and compared with the first RAM test result stored in the register 13 (the step ST15). In cases where the I-th RAM test result matches the first RAM test result (the step ST23), because the comparison indicates that no faulty portion newly occurs in the RAM 1 under the I-th test condition in spite of the rising of the temperature of the semiconductor apparatus, it is confirmed in the LSI built-in self repair circuit 11 that the repair of the faulty portion of the RAM 1 under the I-th test condition is possible. Therefore, the temperature of the semiconductor apparatus is detected by the temperature sensor 21 (a step ST43 denoting the confirmation step), and it is judged in the temperature judging circuit (not shown) or the LSI built-in self repair circuit 11 whether or not the temperature of the semiconductor apparatus detected by the temperature sensor 21 is equal to or higher than the second temperature (a step ST44 denoting the confirmation step). In cases where the temperature of the semiconductor apparatus is equal to or higher than the second temperature, it is judged in the LSI built-in self repair circuit 11 that the repair of the faulty portion of the RAM 1 is possible in a temperature range from the first temperature to the second temperature, and the procedure is completed. Therefore, a correct working of the RAM 1 in the normal operation is guaranteed in the temperature range from the first temperature to the second temperature on condition that the RAM 1 is controlled by the redundancy control circuit 3 to avoid the use of the faulty portion of the RAM 1 in the normal operation.

In contrast, in cases where the temperature of the semiconductor apparatus is lower than the second temperature, the procedure of the testing method is continued until the I-th self-test of the RAM 1 is performed N times.

In cases where the I-th self-test of the RAM 1 is performed N times before the temperature of the semiconductor apparatus reaches the second temperature (a step ST46), the testing method is finished. In this case, though a correct working of the RAM 1 in the normal operation is not guaranteed in the temperature range from the first temperature to the second temperature, because it is judged in the LSI built-in self repair circuit 11 that the repair of the faulty portion of the RAM 1 is possible in a temperature range from the first temperature to a third temperature corresponding to the (N+1)-th self-test of the RAM 1 finally performed, a correct working of the RAM 1 in the normal operation is guaranteed in the temperature range from the first temperature to the third temperature on condition that the RAM 1 is controlled by the redundancy control circuit 3 to avoid the use of the faulty portion of the RAM 1 in the normal operation.

In the testing method for the RAM 1 shown in FIG. 6, in cases where the I-th self-test of the RAM 1 is performed N times before the temperature of the semiconductor apparatus reaches the second temperature, the procedure of the testing method is finished. However, it is applicable that the I-th self-test of the RAM 1 be performed until the temperature of the semiconductor apparatus reaches the second temperature.

Also, in this embodiment, the temperature condition is changed each time the self-test of the RAM 1 is performed. However, it is applicable that a power supply voltage applied to the RAM 1 through the semiconductor apparatus be changed as a test condition in place of (or in addition to) the temperature of the RAM 1 each time the self-test of the RAM 1 is performed. For example, the power supply voltage is set to a low value in the first self-test of the RAM 1, and the power supply voltage is gradually increased each time the I-th self-test of the RAM 1 is performed. Also, it is applicable that the power supply voltage is changed in random. The control of the power supply voltage is, for example, performed in the LSI built-in self-repair circuit 11 for an electric source circuit (not shown) of the electronic system 300.

Accordingly, in the fourth embodiment, the self-test of the RAM 1 is repeatedly performed in the same manner as each other while considering a time change of the test condition such as temperature of the semiconductor apparatus or the power supply voltage applied to the RAM 1 through the semiconductor apparatus. That is, the logical test of the RAM 1 at the first temperature and a plurality of logical tests of the RAM 1 in a temperature range from the first temperature to the second temperature are performed in the same manner as each other, or the logical tests of the RAM 1 at a first power supply voltage applied to the RAM 1 through the semiconductor apparatus and a plurality of logical tests of the RAM 1 in a power supply voltage range from the first power supply voltage to a second power supply voltage are performed in the same manner as each other, the RAM test results are compared with each other to check whether or not the faulty portion of the RAM 1 changes with the temperature of the semiconductor apparatus or the power supply voltage applied to the RAM 1 through the semiconductor apparatus, and it is judged according to a compared result whether or not the repair of the faulty portion of the RAM 1 is possible in the temperature range or the power supply voltage range. Therefore, a test of the RAM 1 can be performed at a high reliability according to the testing method in the test apparatus of the semiconductor apparatus while considering the change of the test condition such as temperature or power supply voltage. Also, because results of the logical tests for the change of the temperature or the power supply voltage can be successively confirmed, the reliability of the test result for the change of the temperature or the power supply voltage can be heightened.

Embodiment 5

Figure 7:
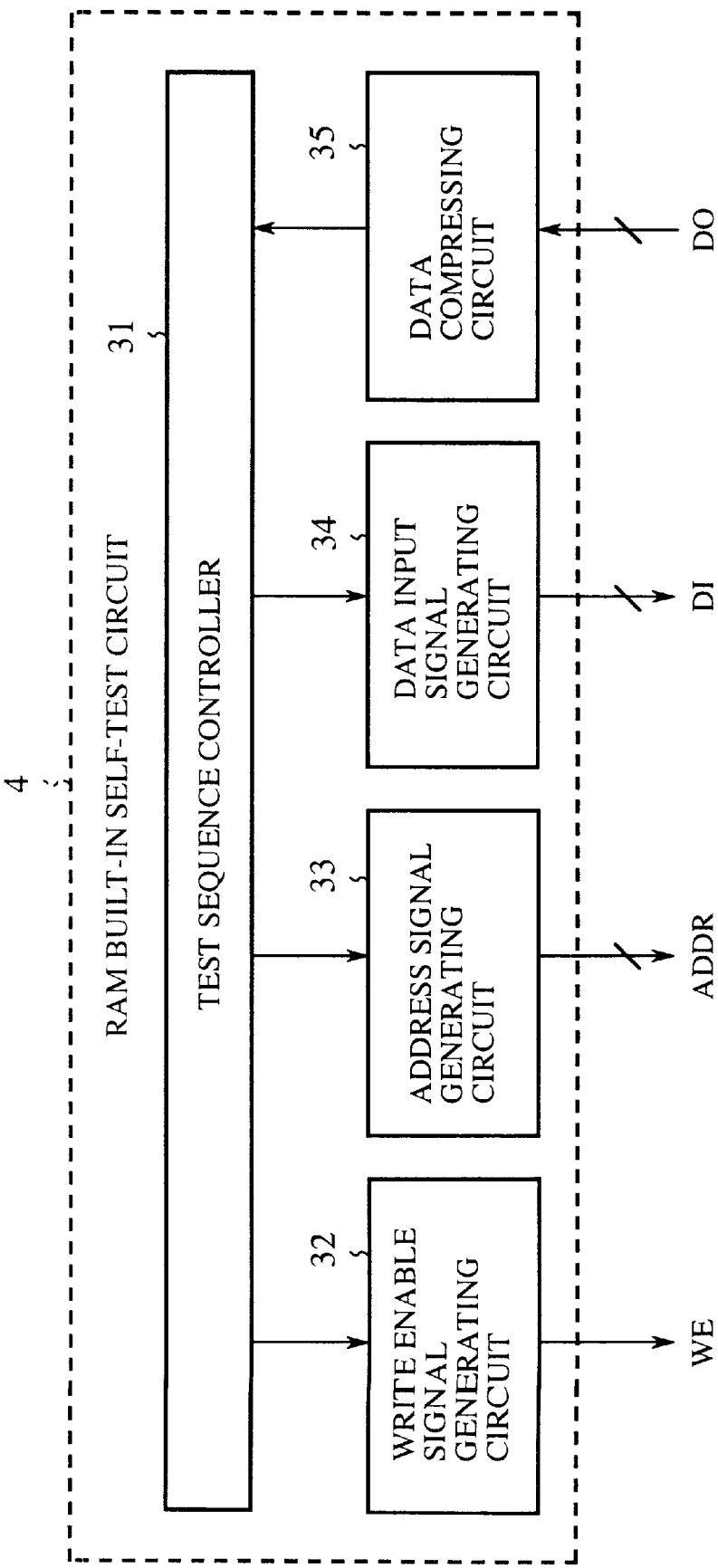
FIG. 7 is a block diagram showing the configuration of a RAM built-in self-test circuit used in the test apparatus of each of the first to fourth embodiments, according to a fifth embodiment of the present invention.

FIG. 7 is a block diagram showing the configuration of the RAM built-in self-test circuit 4 used in the test apparatus in the semiconductor apparatus of each of the first to fourth embodiments, according to a fifth embodiment of the present invention.

In FIG. 7, a reference sign 31 indicates a test sequence controller, a reference sign 32 indicates a write enable signal generating circuit, a reference sign 33 indicates an address signal generating circuit, a reference sign 34 indicates a data input signal generating circuit, and a reference sign 35 indicates a data compressing circuit for compressing a data output signal DO of the RAM 1 and outputting the compressed data output signal DO as a CMPRESULT signal.

Figure 8:
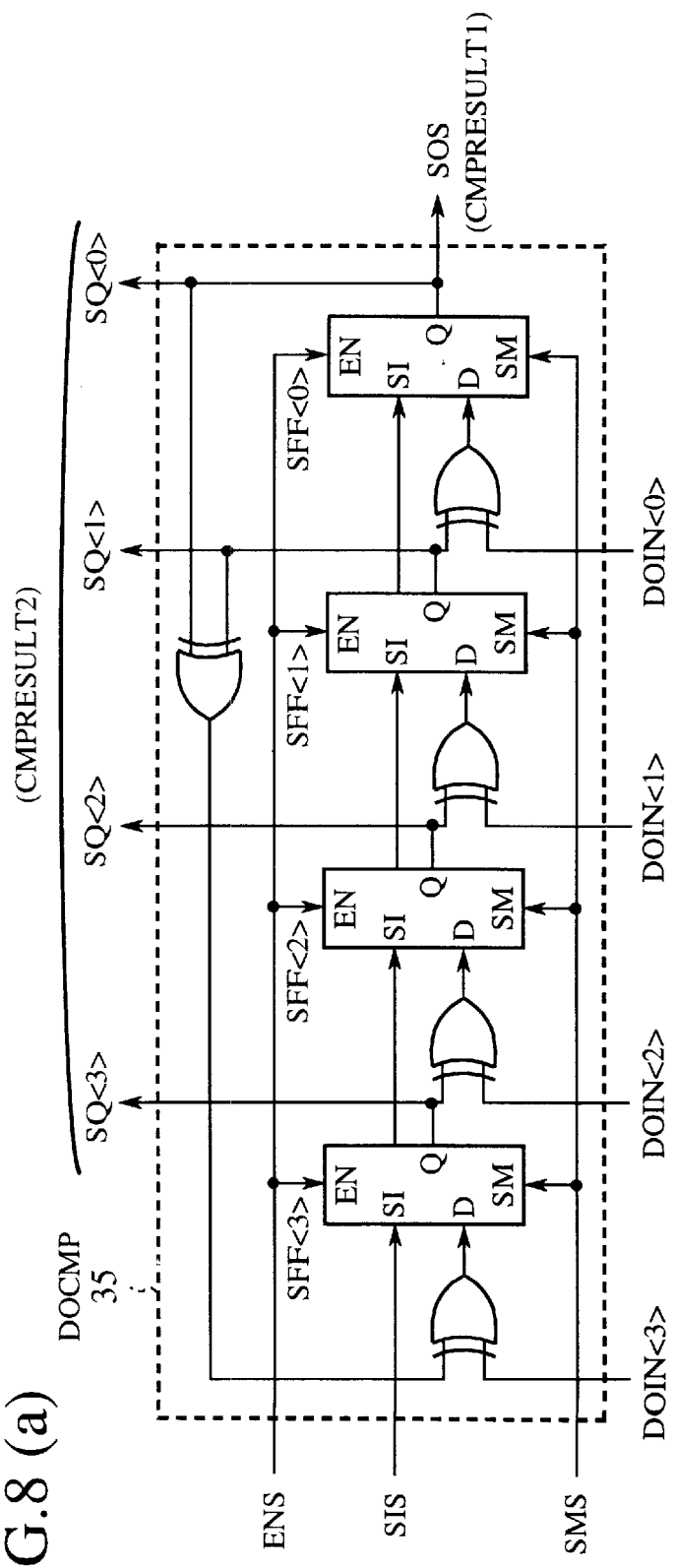
FIG. 8(a) is a circuit diagram showing a configuration example of a data compressing circuit used in the test apparatus of each of the first to fourth embodiments in cases where the data compressing circuit is formed of a multi-input signature register (MISR) type data compressing circuit.
FIG. 8(b) is a circuit block diagram showing each scan flip-flop used in the MISR type data compressing circuit shown in FIG. 8(a)
Figure 8:
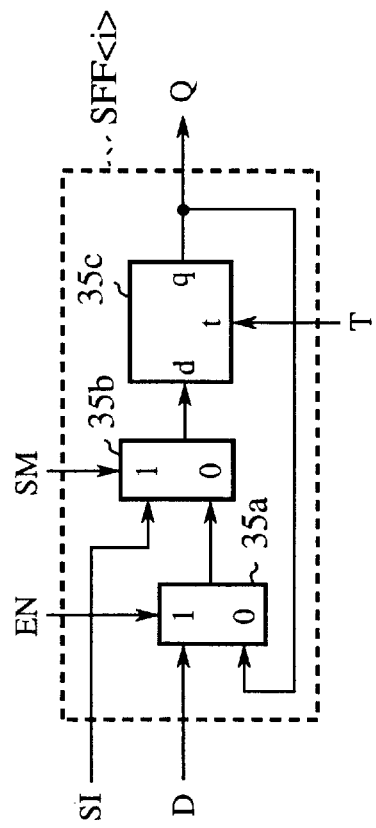

FIG. 8(a) is a circuit diagram showing a configuration example of the data compressing circuit 35 used in the test apparatus in the semiconductor apparatus of each of the first to fourth embodiments in cases where the data compressing circuit 35 is formed of a multi-input signature register (MISR) type data compressing circuit.

The data compressing circuit 35 is formed of a 4-bit MISR type data compressing circuit, and an MISR type corresponding to the number of bits of a signal output from the RAM 1 is normally used for the data compressing circuit 35. In this case, the MISR type data compressing circuit 35 has four scan flip-flops SFF with enable function, and an enable control signal ENS, a serial input data signal SIS which is output from the test sequence controller 31 and is compared with the data output signal DO (composed of DOIN<0> to DOIN<3>) of the RAM1, and a parallel/serial output control signal SMS, which is used to control piece of data of the MISR type data compressing circuit 35 to be output in parallel to each other or to be output in serial to each other, are input to the MISR type data compressing circuit 35. Here, the enable control signal ENS is set to "1" in a RAM output compressing cycle and is set to "0" in a RAM output no-compressing cycle.

FIG. 8(b) is a circuit block diagram showing each scan flip-flop used in the MISR type data compressing circuit 35 shown in FIG. 8(a).

In FIG. 8(b), a reference sign 35a indicates a selector for selecting an input signal according to the enable control signal ENS input to an enable control signal input terminal EN. In cases where the enable control signal ENS is "1", a data input signal input to a data input terminal D is selected. Also, in cases where the enable control signal ENS is "0", an output signal output from an output terminal Q of the scan flip-flop is selected. A reference sign 35b indicates a selector for selecting an input signal according to the parallel/serial output control signal SMS input to a parallel/serial output control signal input terminal SM. In cases where the parallel/serial output control signal SMS is "1", the serial input data signal SIS input to a serial input data input terminal SI is selected. Also, in cases where the parallel/serial output control signal SMS is "0", and an output signal of the selector 35a is selected. A reference sign 35c indicates a flip-flop.

An operation of the MISR type data compressing circuit 35 is described.

A clock signal T is input to the flip-flop 35c of each scan flip-flop of the MISR type data compressing circuit 35, so that the scan flip-flops are operated in synchronization with each other. The data output signal DO (composed of data DOIN<0> to DOIN<3>) of the RAM 1 is compressed in the MISR type data compressing circuit 35, and a signature is produced as a compressed test result. Thereafter, piece of data of the test result compressed in the MISR type data compressing circuit 35 are output in parallel to each other from CMPRESULT-2 terminals as signals SQ<0> to SQ<3>, or the test result compressed in the MISR type data compressing circuit 35 is output in serial from a CMPRESULT-1 terminal as a signal SOS in cases where a serial shift operation is performed by setting the parallel/serial output control signal SMS to "1".

Accordingly, in cases where the MISR type data compressing circuit 35 is used for the RAM built-in self-test circuit 4, the data output signal DO of the RAM1 is compressed while the serial input data signal SIS output from the test sequence controller 31 and the DOIN<0> to DOIN<3> of the data output signal DO of the RAM1 are compared with each other, so that the test of the RAM 1 can be performed according to the compressed data output signal DO. Therefore, the test of the RAM 1 can be performed at a high reliability in the testing method and the test apparatus of the semiconductor apparatus while considering the change of the test condition such as temperature or power supply voltage.

FIG. 9(a) is a circuit diagram showing a configuration example of the data compressing circuit 35 used in the test apparatus in the semiconductor apparatus of each of the first to fourth embodiments in cases where the data compressing circuit 35 is formed of a serial-input signature register (SISR) type data compressing circuit.

An SISR type data compressing circuit 35 is generally formed by combining a scan-path circuit normally used and a serial input signature register. In this embodiment shown in FIG. 9(*a*), an SISR type data compressing circuit 35 is formed bycombining a 4-bit scan-path circuit 36 and a 4-bit serial input signature register 37. The 4-bit scan-path circuit 36 has four scan flip-flops SFF<0> to SFF<3>, and no enable function is given to each scan flip-flop SFF. The 4-bit serial input signature register 37 has four enable flip-flops EFF<0> to EFF<3> with enable function.

In the SISR type data compressing circuit 35, an enable control signal ENS, a serial input data signal SIDO output from the test sequence controller 31, pieces of data DOIN<0> to DOIN<3> of the data output signal DO of the RAM1 and a selection control signal SMDO used to select a selection, in which the serial input data signal SIDO input to a serial input data input terminal SI of each scan flip-flop of the scan-path circuit 36 or the data output signal DOIN<0> to DOIN<3> of the RAM1 input to a data input terminal D is selected, are input.

In this embodiment, the number of bits in the scan-path circuit 36 is the same as that in the serial input signature register 37. However, it is applicable that the number of bits in the scan-path circuit 36 differ from that in the serial input signature register 37 on condition that the number of bits in the scan-path circuit 36 agrees with that of the data output signal DO of the RAM 1.

Figure 9:
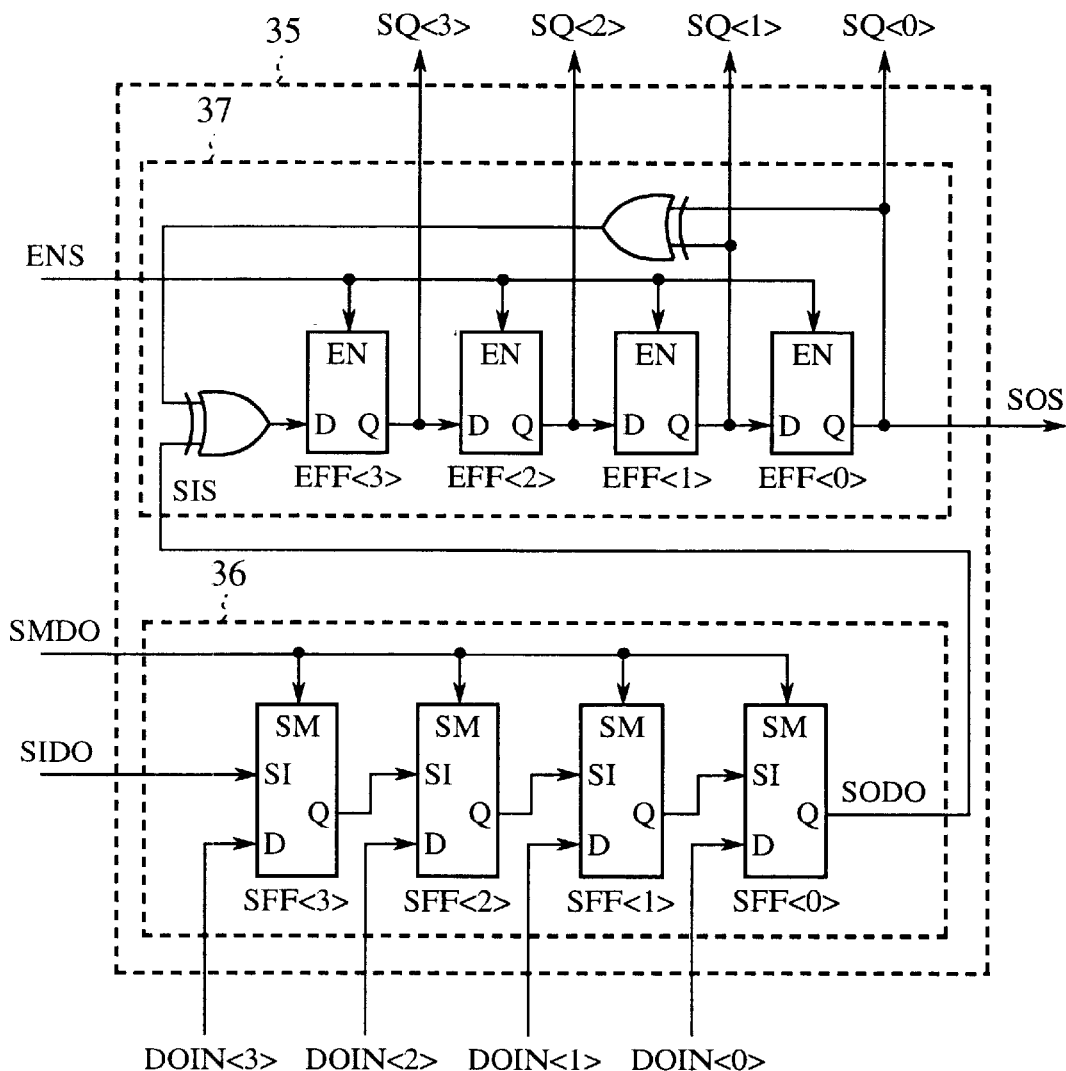
FIG. 9(a) is a circuit diagram showing a configuration example of the data compressing circuit used in the test apparatus of each of the first to fourth embodiments in cases where the data compressing circuit is formed of a serial-input signature register (SISR) type data compressing circuit.
FIG. 9(b) is a circuit block diagram showing each enable flip-flop EFF used in the SISR type data compressing circuit shown in FIG. 9(a)
Figure 9:
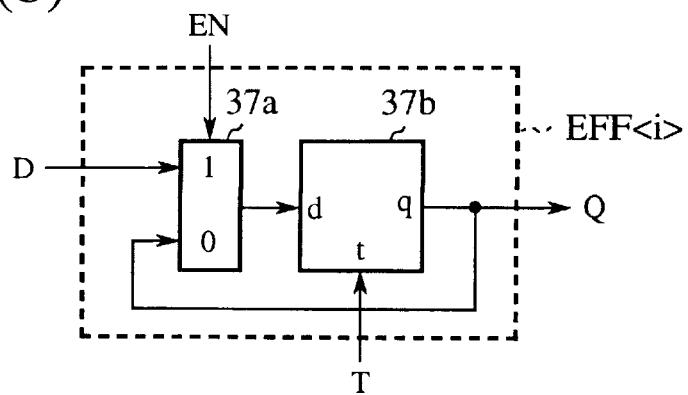

FIG. 9(*b*) is a circuit block diagram showing each enable flip-flop EFF used in the SISR type data compressing circuit 35 shown in FIG. 9(*a*).

In FIG. 9(*b*), a reference sign 37*a* indicates a selector. The selector 37*a* selects a data input signal input to a data input terminal D in cases where the enable control signal ENS is "1" and selects an output signal output from an output terminal Q of the enable flip-flop in cases where the enable control signal ENS is "0". A reference sign 37*b* indicates a flip-flop.

An operation of the SISR type data compressing circuit 35 is described.

A clock signal T is input to the flip-flop 37*b* of each enable flip-flop of the SISR type data compressing circuit 35, so that the enable flip-flops are operated in synchronization with each other. In the scan-path circuit 36, the pieces of data DOIN<0> to DOIN<3> of the data output signal DO of the RAM 1 are input to the scan flip-flops SFF<0> to SFF<3> in cases where the selection control signal SMDO is set to "0", and the pieces of data DOIN<0> to DOIN<3> of the data output signal DO of the RAM 1 are output in serial from an SODO terminal when the selection control signal SMDO is set to "1". Therefore, a parallel/serial data conversion is performed for the pieces of data DOIN<0> to DOIN<3> in the scan-path circuit 36. The enable control signal ENS and the selection control signal SMDO normally have the same polarity.

Accordingly, in cases where the SISR type data compressing circuit 35 is used for the RAM built-in self-test circuit 4, the serial input data signal SIDO output from the test sequence controller 31 and the pieces of data DOIN<0> to DOIN<3> of the data output signal DO of the RAM1 are compressed, so that the test of the RAM 1 can be performed according to the compressed serial input data signal and the compressed data output signal DO. Therefore, the test of the RAM 1 can be performed at a high reliability in the testing method and the test apparatus of the semiconductor apparatus while considering the change of the test condition such as temperature or power supply voltage.

Figure 10:
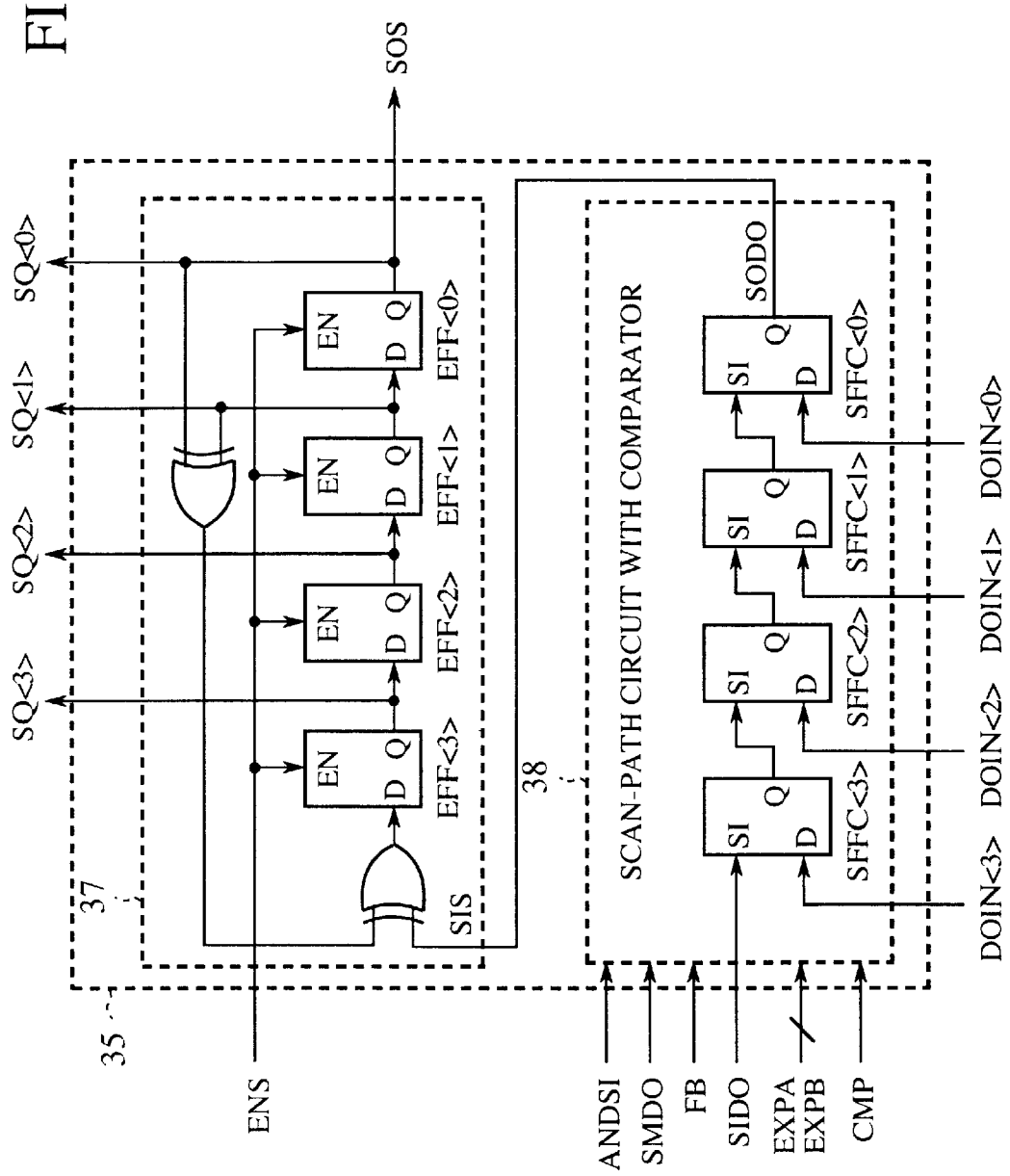
FIG. 10 is a circuit diagram showing another configuration example of an SISR type data compressing circuit used in the test apparatus of each of the first to fourth embodiments.

FIG. 10 is a circuit diagram showing another configuration example of an SISR type data compressing circuit 35 used in the test apparatus in the semiconductor apparatus of each of the first to fourth embodiments.

An SISR type data compressing circuit 35 shown in FIG. 10 is obtained by replacing the scan-path circuit 36 of the SISR type data compressing circuit 35 shown in FIG. 9(*a*) with a scan-path circuit 38 with a comparator.

The scan-path circuit 38 with the comparator is disclosed in the Published Unexamined Japanese Application H11-265597 (1999).

Figure 11:
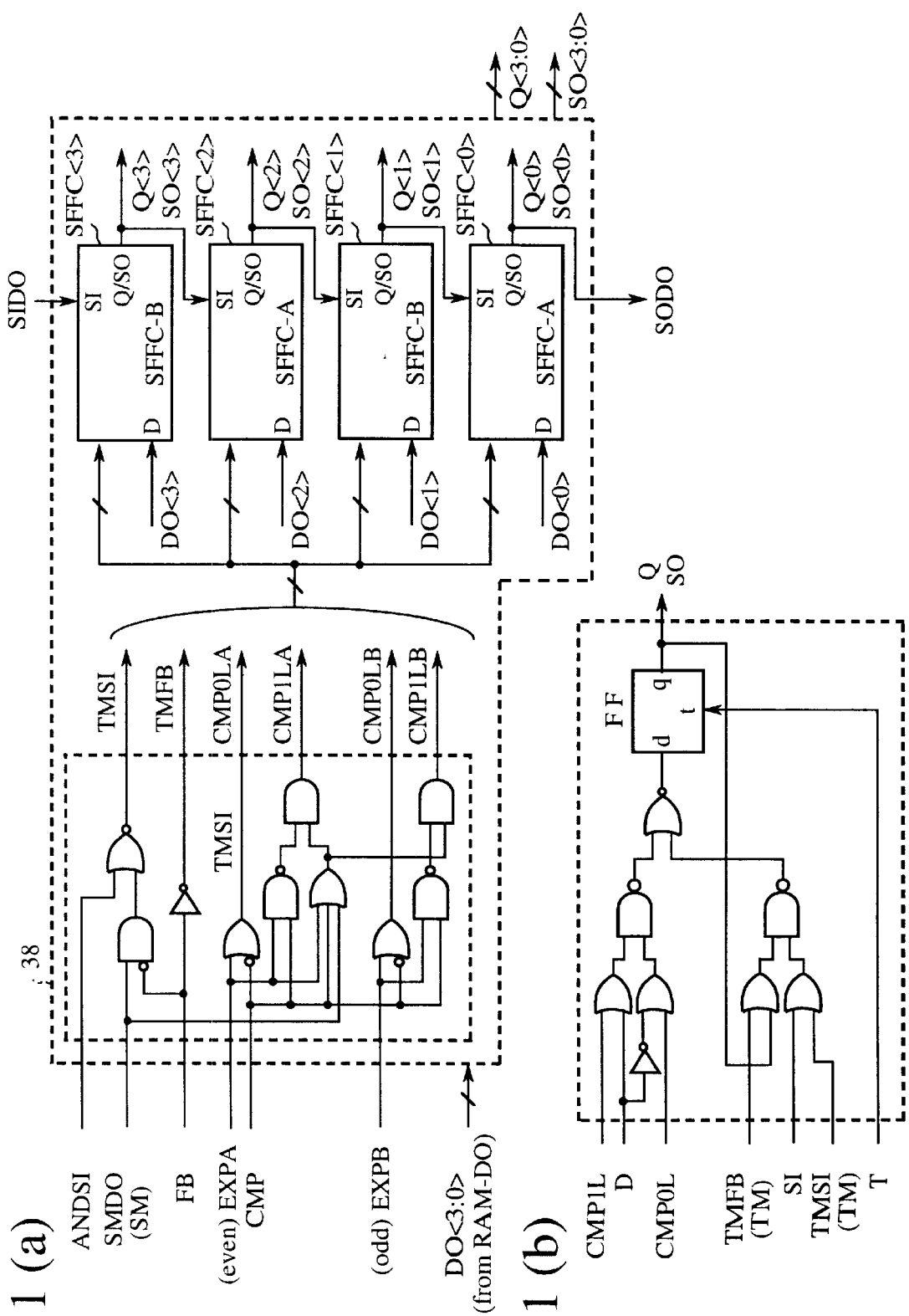
FIG. 11(a) is a circuit diagram showing the configuration of a scan-path circuit with a comparator shown in FIG. 10.
FIG. 11(b) is a circuit diagram showing a configuration example of a scan flip-flop with a comparator used in the scan-path circuit shown in FIG. 11(a)

FIG. 11(*a*) is a circuit diagram showing the configuration of the scan-path circuit 38 with the comparator shown in FIG. 10, and FIG. 11(*b*) is a circuit diagram showing a configuration example of a scan flip-flop with a comparator SFFC used in the scan-path circuit 38 shown in FIG. 11(*a*).

In the SISR type data compressing circuit 35 shown in FIG. 10, not only the enable control signal ENS and the serial input data signal SIDO output from the test sequence controller 31 input to the SISR type data compressing circuit 35 shown in FIG. 9 are input, but also a selection control signal ANDSI used to select a shifting-compare mode, expected values EXPA and EXPB, a signal FB and a comparing operation control signal CMP are input.

In a scan flip-flop with a comparator SFFC-A of the scan-path circuit 38 shown in FIG. 11(*a*), a CMP1LA signal is input as a CMP1L signal, and a CMP0LA signal is input as a CMP0L signal. Also, in a scan flip-flop with a comparator SFFC-B of the scan-path circuit 38 shown in FIG. 11(*a*), a CMP1L signal is input as a CMP1L signal, and a CMP0LB signal is input as a CMP0L signal.

Figure 13:
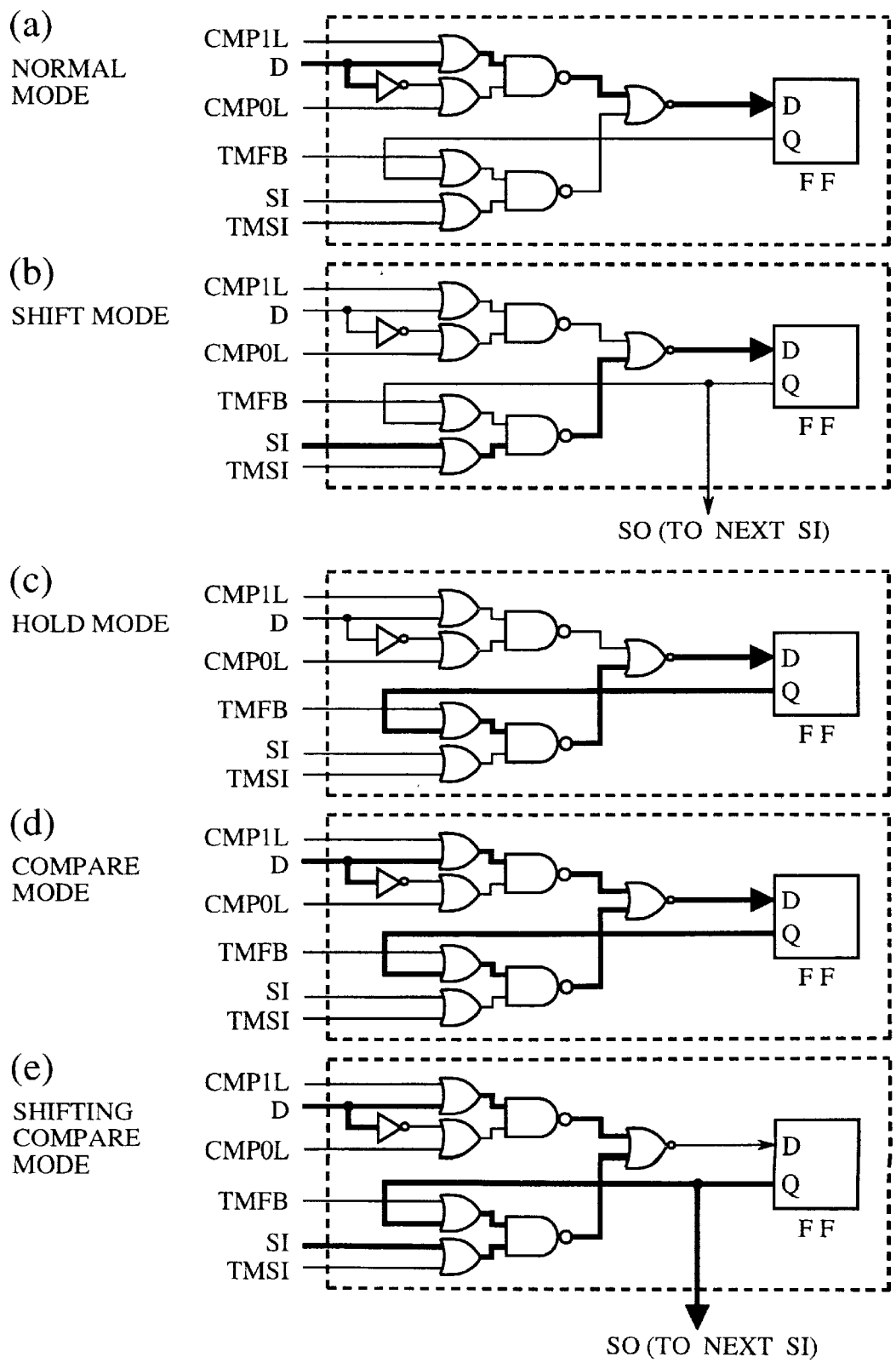
FIGS. 13a–13e are an explanatory diagram showing a signal flow in the scan flip-flop with the comparator shown in FIG. 11(b) at each of the modes shown in FIG. 12.

FIG. 12 is a table of truth values showing an operation of the scan-path circuit with the comparator 38 at each of modes, and FIG. 13 is an explanatory diagram showing a signal flow in the scan flip-flop with the comparator SFFC at each of the modes shown in FIG. 12. The signal flow is indicated by thick lines in FIG. 13.

In a normal mode, the data output signal DO input to the data input terminal D is fetched in a flip-flop FF of each scan flip-flop with the comparator SFFC.

In a shift mode, a serial shift operation is performed in the scan-path circuit 38. To set "1" to the flip-flop FF of each scan flip-flop with the comparator SFFC before a comparison is performed at a compare mode described later, the shift mode is performed.

In case of a hold mode, the RAM test result obtained in the RAM built-in self-test circuit 4 in the middle of the test of the RAM 1 is held.

In a compare mode, the data output signal DO of the RAM 1 is compared with the expected values EXPA and EXPB. Before the comparison, "1" is set to the flip-flop FF of each scan flip-flop with the comparator SFFC at the shift mode. Thereafter, one of the signals CMP1LA and CMP0LA and one of the signals CMP1LB and CMP0LB are set to "0" according to the expected values EXPA and EXPB, and a comparison operation is performed in synchronization with the clock signal T input to the flip-flop FF of each scan flip-flop with the comparator SFFC. In cases where the piece of data DO<*i*> of the data output signal DO of the RAM 1 differs from the corresponding expected value, the value of the corresponding flip-flop FF is changed to "0". After the test of the RAM 1 for all addresses is completed, the RAM test result is read out from the SODO terminal in an operation of the shift mode.

A shifting compare mode is obtained by combining the compare mode and the shift mode, and the selection control signal ANDSI is set to "1". In the shifting compare mode, when a fault of the RAM 1 is detected by detecting one flip-flop FF set to "0", the detection of the fault is propagated to other scan flip-flops SFFC arranged at lower stages, and the flip-flops FF of the scan flip-flops SFFC are set to "0" one by one. Therefore, a fault detecting time in the shifting compare mode can be shortened as compared with that in the compare mode.

In the SISR type data compressing circuit 35 shown in FIG. 10, the RAM test result read out in an operation of the shift mode is compressed in the serial input signature register 37.

Accordingly, in cases where the SISR type data compressing circuit 35 shown in FIG. 10 is used for the RAM built-in self-test circuit 4, each of the normal mode, the shift mode, the hold mode, the compare mode and the shifting compare mode is selected, so that the data compression can be flexibly and efficiently performed in the testing method and the test apparatus of the semiconductor apparatus.

Embodiment 6

Figure 14:
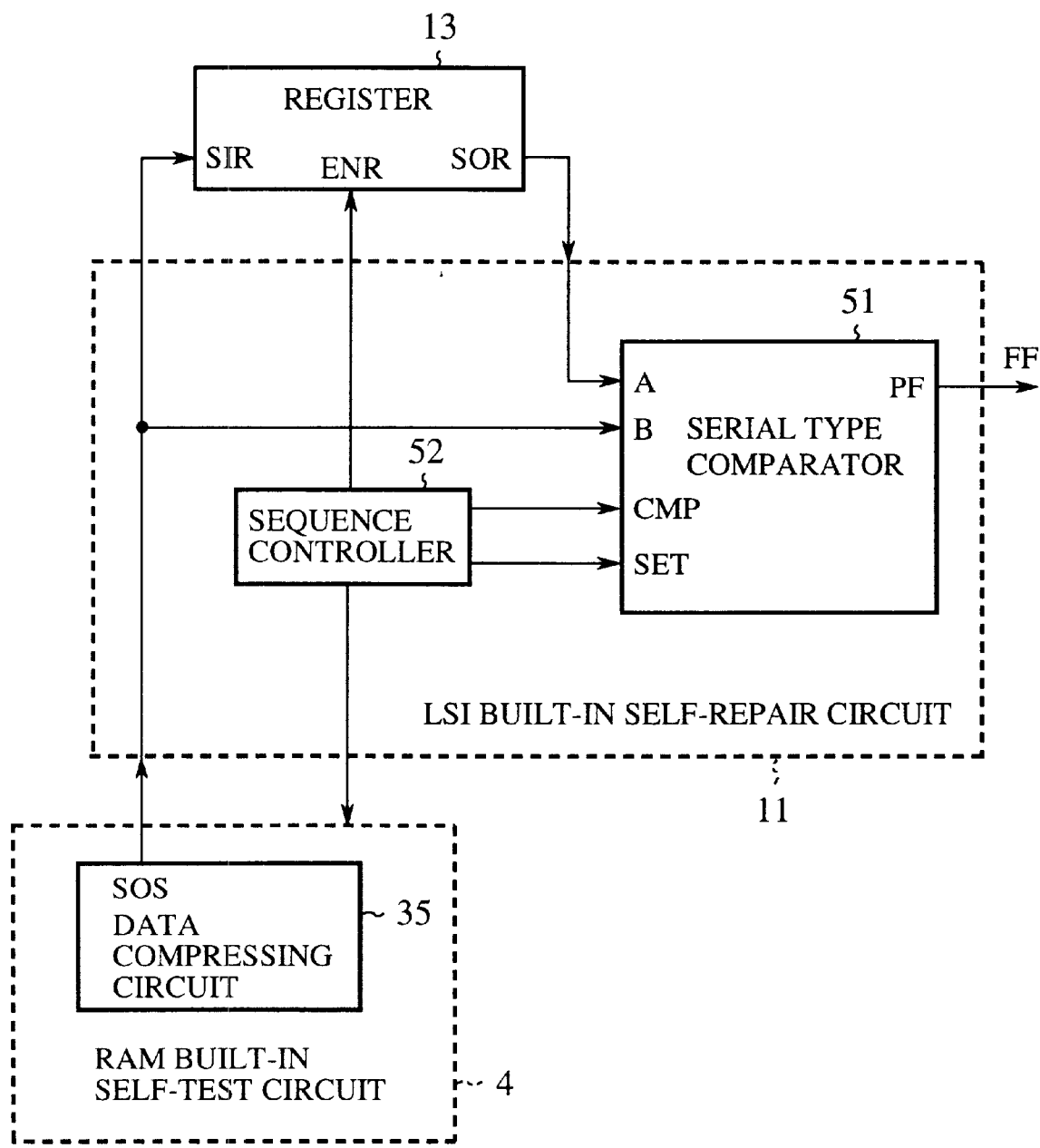
FIG. 14 is a circuit block diagram showing a partial configuration of the group of a register, a LSI built-in self-repair circuit and an RAM built-in self-test circuit 4 of each of the first to fifth embodiments, according to a sixth embodiment of the present invention.

FIG. 14 is a circuit block diagram showing a partial configuration of the group of the register 13, the LSI built-in self-repair circuit 11 and the RAM built-in self-test circuit 4 of each of the first to fifth embodiments, according to a sixth embodiment of the present invention.

In FIG. 14, a reference sign 51 indicates a serial type comparator, and a reference sign 52 indicates a sequence controller. The serial type comparator 51 has an input terminal A to which the first RAM test result (a first comparison input) read out from the register 13 in serial is input, an input terminal B to which the second RAM test result or the I-th RAM test result (a second comparison input) compressed in the data compressing circuit 35 is directly input in serial, a comparison control signal input terminal CMP to which a comparison control signal output from the sequence controller 52 is input to control a comparison operation, a set signal input terminal SET to which a set signal output from the sequence controller 52 is input, and an output terminal PF from which a comparison result is output.

Figure 15:
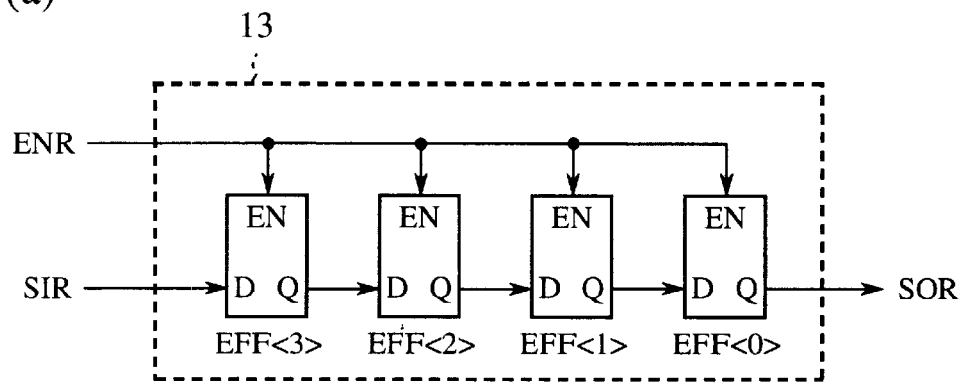
FIG. 15(a) is a circuit block diagram showing a configuration example of the register.
FIG. 15(b) is a circuit block diagram showing a configuration of each flip-flop composing the register shown in FIG. 15(a)
Figure 15:
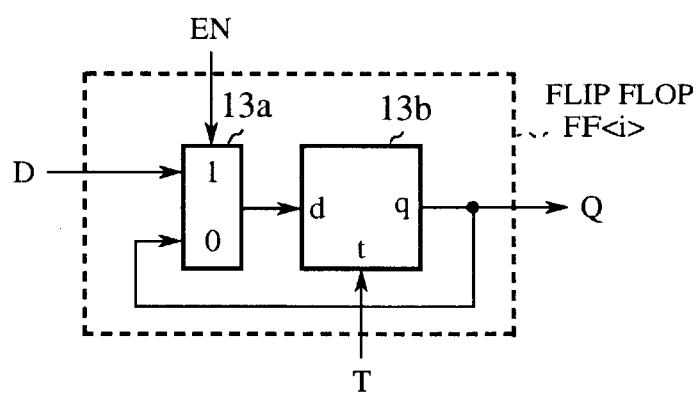

FIG. 15(a) is a circuit block diagram showing a configuration example of the register 13. The register 13 comprises four flip-flops FF<0> to FF<3> which respectively have an enable control terminal, and the first RAM test result compressed in the data compressing circuit 35 is stored in the flip-flops FF<0> to FF<3>. A reference sign SIR indicates a serial input terminal of the register 13, and a reference sign SOR indicates a serial output terminal of the register 13.

FIG. 15(b) is a circuit block diagram showing a configuration of each flip-flop FF composing the register 13. Each flip-flop FF composing the register 13 comprises a selector 13a and a flip-flop 13b.

Figure 16:
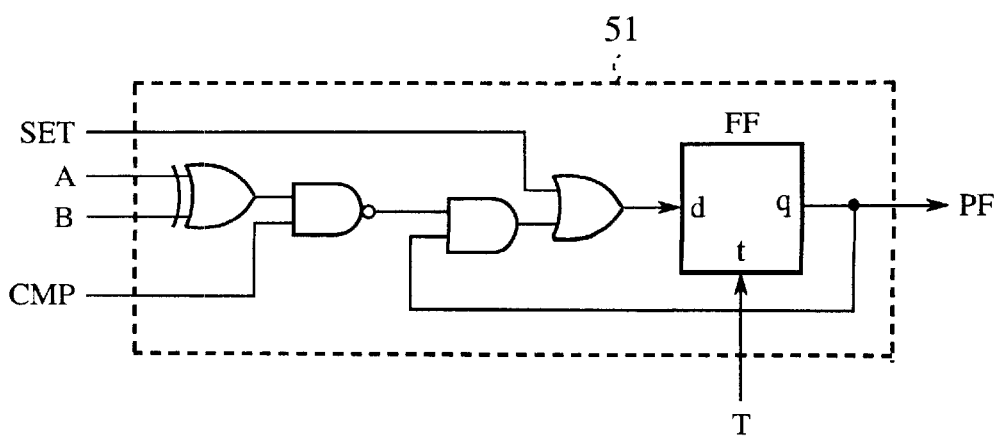
FIG. 16 is a circuit diagram showing a configuration example of a serial type comparator shown in FIG. 14.

FIG. 16 is a circuit diagram showing a configuration example of the serial type comparator 51 shown in FIG. 14. The serial type comparator 51 comprises a group of an EXOR circuit, an NAND circuit, an AND circuit and an OR circuit respectively functioning as a gate and a flip-flop FF.

Next, an operation of the group of the register 13, the LSI built-in self-repair circuit 11 and the RAM built-in self-test circuit 4 is described.

In the serial type comparator 51 shown in FIG. 16, before a comparison operation, a set signal set to "1" is input to the set signal input terminal SET, a clock signal T is input to the flip-flop FF to set the flip-flop FF, and an output of the output terminal PF denoting a Q output of the flip-flop FF is set to "1". Thereafter, a comparison control signal input to the comparison control signal input terminal CMP is set to "1", and the clock signal T is again input to the flip-flop FF. Therefore, the first comparison input denoting the first RAM test result, which is read out from the register 13 and is input to the input terminal A, is compared with the second comparison input denoting the second RAM test result or the I-th RAM test result, which is directly input to the input terminal B from the data compressing circuit 35. In cases where the first RAM test result does not match the second comparison input, the flip-flop FF is reset, so that the output of the output terminal PF is changed to "0".

The LSI built-in self-repair circuit 11 comprises the sequence controller 52 and the serial type comparator 51, so that following operations are performed in the LSI built-in self-repair circuit 11.

(1) The LSI built-in self-repair circuit 11 makes the register 13 store the compressed first RAM test result which is produced in the data compressing circuit 35 of the RAM built-in self-test circuit 4 under the first test condition.

(2) The serial type comparator 51 of the LSI built-in self-repair circuit 11 compares the compressed second (or I-th) RAM test result, which is produced in the data compressing circuit 35 of the RAM built-in self-test circuit 4 under the second (or I-th) test condition, with the compressed first RAM test result stored in the register 13. In cases where an enable signal input to an enable signal input terminal ENR of each of the flip-flops FF<0> to FF<3> and the comparison control signal input to the comparison control signal input terminal CMP of the serial type comparator 51 are made active, a compressed RAM test result currently obtained in the data compressing circuit 35 can be stored in the register 13.

Accordingly, in the sixth embodiment, the compressed first RAM test result (or the first fault information) produced in the data compressing circuit 35 of the RAM built-in self-test circuit 4 under the first test condition is stored in the register 13, and the compressed second (or I-th) RAM test result produced under the second (or I-th) test condition is compared in the serial type comparator 51 with the compressed first RAM test result stored in the register 13 (the step ST15 shown in FIG. 2, FIG. 3, FIG. 5 and FIG. 6). Therefore, the test of the RAM 1 can be performed at a high reliability in the testing method and the test apparatus of the semiconductor apparatus while considering the change of the test condition such as temperature or power supply voltage.

What is claimed is:

1. A method of testing a to-be-tested circuit comprising:
   an initial test condition testing step of performing a logical test of the to-be-tested circuit under a first test condition to obtain first fault information and judging, according to a first fault information, whether or not the repair of the faulty portion of the to-be-tested circuit by a redundancy circuit is possible; and
   a confirmation step including a first step of performing a logical test, which is the same as the logical test performed in the initial test condition testing step, for the to-be-tested circuit under a second test condition different from the first test condition to obtain second fault information, in a case where it is judged that the repair of the faulty portion of the to-be-tested circuit is possible, and a second step of comparing the first fault information with the second fault information to obtain a comparison result which indicates whether the to-be-tested circuit is correctly operable under each of the first test condition and the second test condition.

2. A testing method according to claim 1, further comprising:
a test condition change giving step of giving a change to the first test condition to change a test condition, under which the to-be-tested circuit is tested, to obtain the second test condition.

3. A testing method according to claim 2, wherein the test condition change giving step includes
a step of performing a pseudo-logical test for the to-be-tested circuit or a circuit arranged in a periphery of the to-be-tested circuit to change the test condition.

4. A testing method according to claim 3, wherein the test condition change giving step further includes
a step of judging whether a test condition, under which the to-be-tested circuit is tested, reaches the second test condition, wherein
the step of performing the pseudo-logical test is repeated in a case where it is judged in the judging step that the test condition does not reach the second test condition.

5. A testing method according to claim 1, wherein the first and second steps of the confirming step are repeated prescribed times with a change given to the second test condition, wherein the confirming step further includes a step of confirming a correct operation of the to-be-tested circuit according to a comparison result obtained every time the second step is performed.

6. A testing method according to claim 5, wherein the first and second steps of the confirming step are repeated until the second test condition reaches a predetermined test condition.

7. A testing method according to claim 1, wherein the first test condition corresponds to a first temperature of the to-be-tested circuit, and the second test condition corresponds to a second temperature of the to-be-tested circuit.

8. A testing method according to claim 1, wherein the first test condition corresponds to a first power supply voltage applied to the to-be-tested circuit, and the second test condition corresponds to a second power supply voltage applied to the to-be-tested circuit.

9. A test apparatus of a to-be-tested circuit, comprising:
a register for storing first fault information obtained by performing a logical test of the to-be-tested circuit under a first test condition; and
a test circuit for judging according to the first fault information stored in the register whether or not a faulty portion exists in the to-be-tested circuit, judging according to the first fault information whether or not the repair of a faulty portion of the to-be-tested circuit is possible in a case where the faulty portion exists in the to-be-tested circuit, performing a logical test, which is the same as the logical test performed under the first test condition, for the to-be-tested circuit under a second test condition different from the first test condition to obtain second fault information in a case where the repair of the faulty portion of the to-be-tested circuit is possible, and comparing the first fault information with the second fault information to obtain a comparison result which indicates whether the to-be-tested circuit is correctly operable under each of the first test condition and the second test condition.

10. A test apparatus according to claim 9, wherein the test circuit performs a pseudo-logical test for the to-be-tested circuit or a circuit arranged in a periphery of the to-be-tested circuit to give a change to the first test condition.

11. A test apparatus according to claim 10, wherein the test circuit continues the pseudo-logical test until a test condition, under which the to-be-tested circuit is tested, reaches the second test condition.

12. A test apparatus according to claim 9, wherein the test circuit repeatedly performs the logical test, which is the same as the logical test performed under the first test condition, prescribed times with a change given to the second test condition, and performs a comparison of the first fault information with the second fault information obtained every time the logical test is performed, and
the test circuit confirms, according to a comparison result obtained every time the comparison is performed, that the to-be-tested circuit is correctly operable.

13. A test apparatus according to claim 9, wherein the test circuit repeatedly performs the logical test until the second test condition reaches a predetermined test condition.

14. A test apparatus according to claim 9, wherein the first test condition corresponds to a first temperature of the to-be-tested circuit, and the second test condition corresponds to a second temperature of the to-be-tested circuit.

15. A test apparatus according to claim 9, wherein the first test condition corresponds to a first power supply voltage applied to the to-be-tested circuit, and the second test condition corresponds to a second power supply voltage applied to the to-be-tested circuit.

16. A testing method according to claim 1, wherein the first and second steps of the confirming step are performed again with a change given to the second test condition when the comparison result indicates a match, while the first or second step is not performed any more when the comparison result indicates a mismatch.

17. A test apparatus according to claim 9, wherein the test circuit further performs the logical test again with a change given to the second test condition when the comparison result indicates a match, while not performing the logical test any more when the comparison result indicates a mismatch.

18. A test method according to claim 1, wherein the confirming step is skipped if the repair is impossible in the initial test condition testing step.

19. A test device according to claim 9, formed in a semiconductor apparatus having the to-be-tested circuit.

20. A test device according to claim 9, formed in a portable device having the to-be-tested circuit.

* * * * *